(12) United States Patent
Yang

(10) Patent No.: US 10,608,629 B2
(45) Date of Patent: Mar. 31, 2020

(54) DRIVING CIRCUIT OF A POWER CIRCUIT

(71) Applicant: Delta Electronics, Inc., Taoyuan (TW)

(72) Inventor: Chang-Jing Yang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/167,041

(22) Filed: Oct. 22, 2018

(65) Prior Publication Data

US 2019/0058469 A1    Feb. 21, 2019

Related U.S. Application Data

(63) Continuation-in-part of application No. 15/495,009, filed on Apr. 24, 2017, now Pat. No. 10,326,438, which is a continuation-in-part of application No. 15/395,738, filed on Dec. 30, 2016, now Pat. No. 9,906,221.

(51) Int. Cl.
*H03K 17/687* (2006.01)
*H01L 27/085* (2006.01)
*H03K 17/06* (2006.01)

(52) U.S. Cl.
CPC ....... *H03K 17/6871* (2013.01); *H01L 27/085* (2013.01); *H03K 17/063* (2013.01); *H03K 2017/066* (2013.01)

(58) Field of Classification Search
CPC ............. H03K 17/687; H03K 17/6871; H03K 17/063; H01L 27/085
USPC .... 327/108–112, 427, 434, 437; 326/82, 83, 326/87
See application file for complete search history.

(56) References Cited

U.S. PATENT DOCUMENTS

| | | |
|---|---|---|
| 5,818,209 A | 10/1998 | Masini et al. |
| 6,885,225 B2 | 4/2005 | Ohmichi et al. |
| 9,525,413 B2 | 12/2016 | Roberts et al. |
| 9,780,773 B2 | 10/2017 | Kawata et al. |
| 9,906,221 B1 | 2/2018 | Yang |

(Continued)

FOREIGN PATENT DOCUMENTS

| | | |
|---|---|---|
| CN | 102969889 B | 8/2015 |
| TW | 201121215 A | 6/2011 |

(Continued)

OTHER PUBLICATIONS

Office Action dated Feb. 3, 2020 in Application No. TW108129940.
Office Action dated Dec. 30, 2019 in Application No. TW108126449.

*Primary Examiner* — Tomi Skibinski
(74) *Attorney, Agent, or Firm* — Muncy, Geissler, Olds & Lowe, PC

(57) ABSTRACT

A power circuit includes a power transistor and a driving circuit. The power transistor sinks a current according to a driving voltage. The driving circuit includes a driver which includes a high-side transistor, a low-side transistor, a high-side driver, and a first pre-driver. The high-side transistor provides a low voltage to the driving voltage according to a high-side voltage. The low-side transistor pulls the driving voltage to a ground according to a control signal. The high-side driver includes a plurality of N-type transistors and provides a high voltage to the high-side voltage according to the control signal. The high voltage exceeds an operational gate voltage of the N-type transistors.

40 Claims, 14 Drawing Sheets

(56) References Cited

U.S. PATENT DOCUMENTS 10,014,853 B1 7/2018 Yang
2016/0233859 A1* 8/2016 Roberts ............ H03K 17/04123

FOREIGN PATENT DOCUMENTS

TW        201823905 A    7/2018
TW           I637595 B    10/2018
TW        201909560 A    3/2019

* cited by examiner

DRIVING CIRCUIT OF A POWER CIRCUIT

CROSS REFERENCE TO RELATED APPLICATIONS

This application is a Continuation-In-Part of pending U.S. patent application Ser. No. 15/495,009, filed on Apr. 24, 2017 and entitled "a Driving circuit of a power circuit and a regulator", which claims priority of U.S. patent application Ser. No. 15/395,738, filed on Dec. 30, 2016, the entirety of which is incorporated by reference herein.

BACKGROUND OF THE INVENTION

Field of the Invention

The disclosure generally relates to a driving circuit for driving a GaN power device.

Description of the Related Art

In a power circuit, a charge pump is always required to boost the supply voltage to a higher voltage for driving the power transistor. FIG. 1 illustrates a conventional power circuit. As shown in FIG. 1, the power circuit 100 includes a power transistor 110, a high-side transistor 121, and a low-side transistor 122. The high-side transistor 121 and the low-side transistor 122 are configured to generate the driving voltage VD at the driving node ND so that the power transistor 110 sinks the power current IP according to the driving voltage VD.

Since the driving voltage VD may reach the operation voltage VS, the high-side voltage VHS should be higher than the operation voltage VS to fully turn ON the high-side transistor 121 so that the high-side voltage VHS is higher than the operation voltage VS to ensure the high-side transistor 121 is fully turned ON.

BRIEF SUMMARY OF THE INVENTION

In an embodiment, a power circuit comprises: a power transistor and a driving circuit. The power transistor sinks a power current to a ground according to a driving voltage of a driving node. The driving circuit comprises: a driver comprising a high-side transistor, a low-side transistor, and a high-side driver. The high-side transistor provides a low voltage to the driving node according to a high-side voltage of a high-side node. The low-side transistor couples the driving node to the ground according to a control signal. The high-side driver comprises a plurality of N-type transistors and provides a high voltage to the high-side node according to the control signal. The high voltage exceeds an operational gate voltage of the N-type transistors in the driving circuit.

In an embodiment, a driving circuit for driving a power transistor, in which the power transistor sinks a power current to a ground according to a driving voltage of a driving node, comprises: a driver comprising a high-side transistor, a low-side transistor, and a high-side driver. The high-side transistor provides a low voltage to the driving node according to a high-side voltage of a high-side node. The low-side transistor couples the driving node to the ground according to a control signal. The high-side driver comprises a plurality of N-type transistors and provides the high voltage to the high-side node according to the control signal. The high voltage exceeds an operational gate voltage of the N-type transistors.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
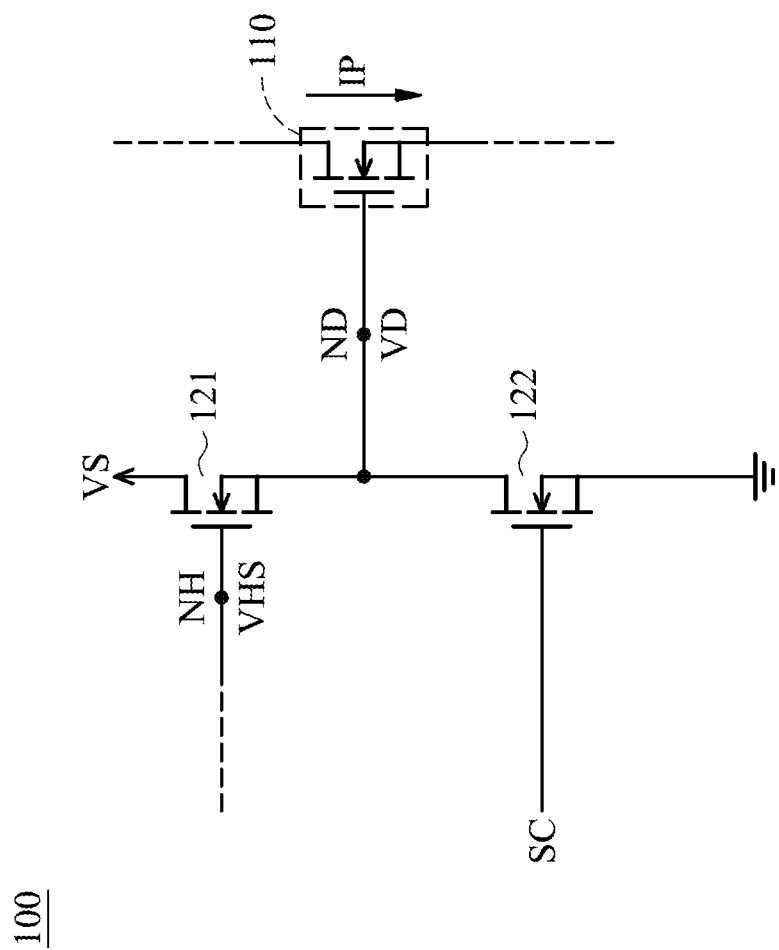
FIG. 1 illustrates a conventional power circuit.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 2:
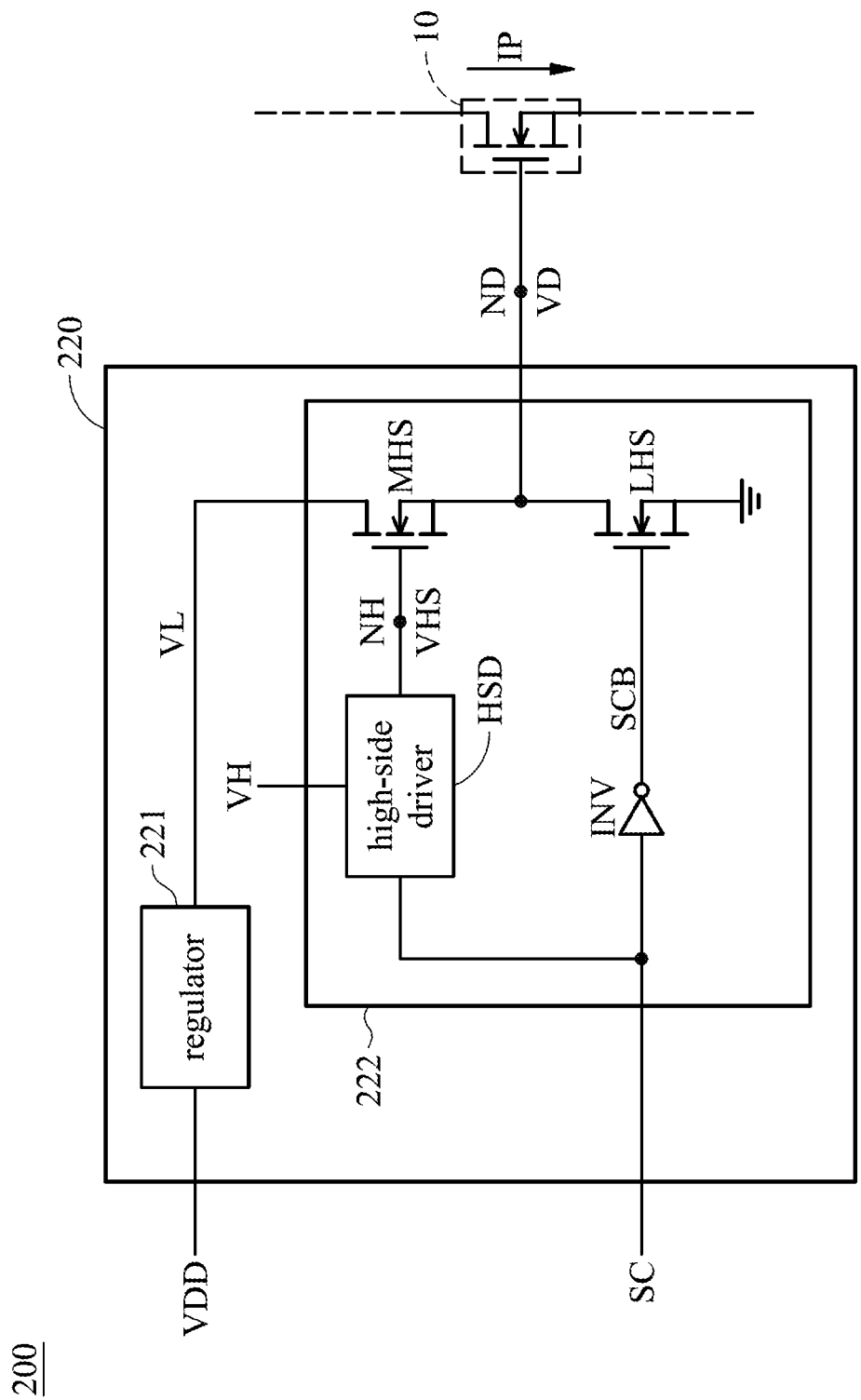
FIG. 2 is a block diagram of a power circuit in accordance with an embodiment of the invention.

FIG. 2 is a block diagram of a power circuit in accordance with an embodiment of the invention. As shown in FIG. 2, the power circuit 200 includes a power transistor 10 and a driving circuit 220. According to an embodiment of the invention, the power transistor 10 is a GaN transistor.

The driving circuit 220 includes a regulator 221 and a driver 222. The regulator 221 is configured to down-convert the supply voltage VDD into a low voltage VL. According to an embodiment of the invention, the supply voltage VDD exceeds the operational gate voltage of all the transistors in the driving circuit 220 such that the regulator 221 down-converts the supply voltage VDD into the low voltage VL, in which the low voltage VL is equal to the operational gate voltage of all the transistors in the driving circuit 220.

As shown in FIG. 2, the driver 222 includes the high-side transistor MHS, the low-side transistor MLS, a high-side driver HSD, and an inverter INV. According to an embodiment of the invention, the high-side transistor MHS corresponds to the high-side transistor 121 in FIG. 1, and the low-side transistor MLS corresponds to the low-side transistor 122 in FIG. 1.

The high-side driver HSD, which is supplied by a high voltage VH, boosts the high logic level of the control signal SC to the high voltage VH, in order to fully turn ON the high-side transistor MHS. According to an embodiment of the invention, the high voltage VH exceeds the low voltage VL.

According to an embodiment of the invention, the high voltage VH is equal to the supply voltage VDD. According to another embodiment of the invention, the high voltage VH is converted from the supply voltage VDD. The low-side transistor MLS pulls the driving voltage VD to the ground according to the control signal SC.

Figure 3:
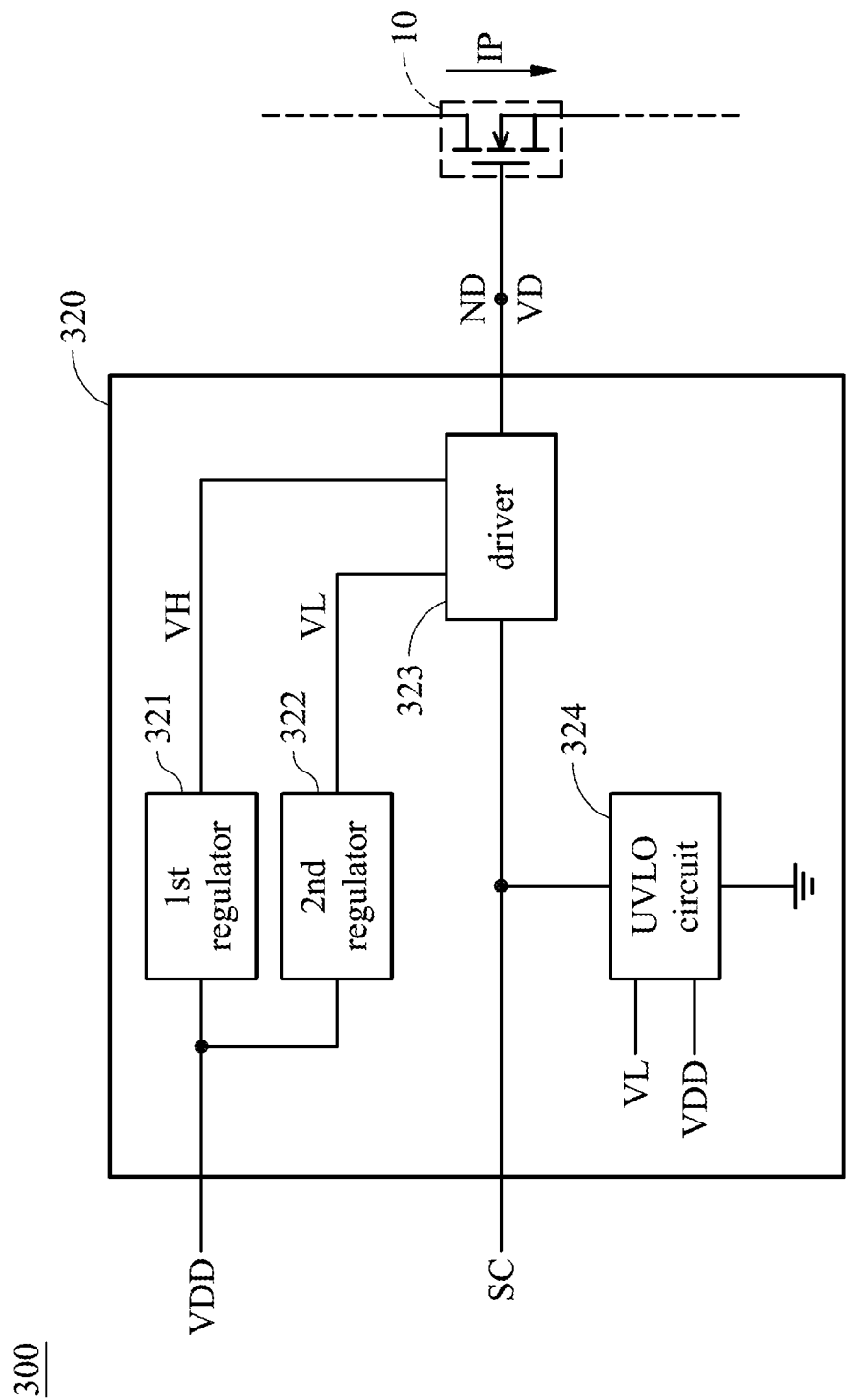
FIG. 3 is a block diagram of a power circuit in accordance with an embodiment of the invention.

FIG. 3 is a block diagram of a power circuit in accordance with an embodiment of the invention. As shown in FIG. 3, the power circuit 300, which is an embodiment of the power circuit 200 in FIG. 2, includes a power transistor 10 and a driving circuit 320. According to an embodiment of the invention, the power transistor 10 is a GaN transistor.

The driving circuit 320 includes a first regulator 321, a second regulator 322, a driver 323, and an under-voltage lockout (UVLO hereafter) circuit 324. The first regulator 321 is configured to down-convert the supply voltage VDD into a high voltage VH, and the second regulator 322 is configured to down-convert the supply voltage VDD into a low voltage VL. According to an embodiment of the invention, the low voltage VL is less than the high voltage VH, and the low voltage VL and the high voltage VH are both less than the supply voltage VDD.

The driver 323 is supplied by the high voltage VH and the low voltage VL and generates the driving voltage VD at the driving node ND according to the control signal SC, such that the power transistor 310 sinks a power current IP according to the driving voltage VD.

According to an embodiment of the invention, the driver 323 includes the high-side transistor 121 and the low-side transistor 122 in FIG. 1, the low voltage VL corresponds to the operation voltage VS in FIG. 1 and the high voltage VH is for the high-side voltage VHS, which will be explained further in the following paragraphs.

The UVLO circuit 324 is supplied by the low voltage VL and configured to detect the supply voltage VDD. When the supply voltage VDD is lower than a threshold, the UVLO circuit 324 pulls the control signal SC to the ground such that the driver 323 is disabled.

According to an embodiment of the invention, the driving circuit 320 may further include a level shifter shifting a control signal SC ranging from the supply voltage VDD to the ground into the control signal SC ranging from the low voltage VL to the ground. For the simplicity of explanation, the level shifter is omitted and the control signal SC hereafter is assumed to be from the low voltage VL to the ground.

Figure 4:
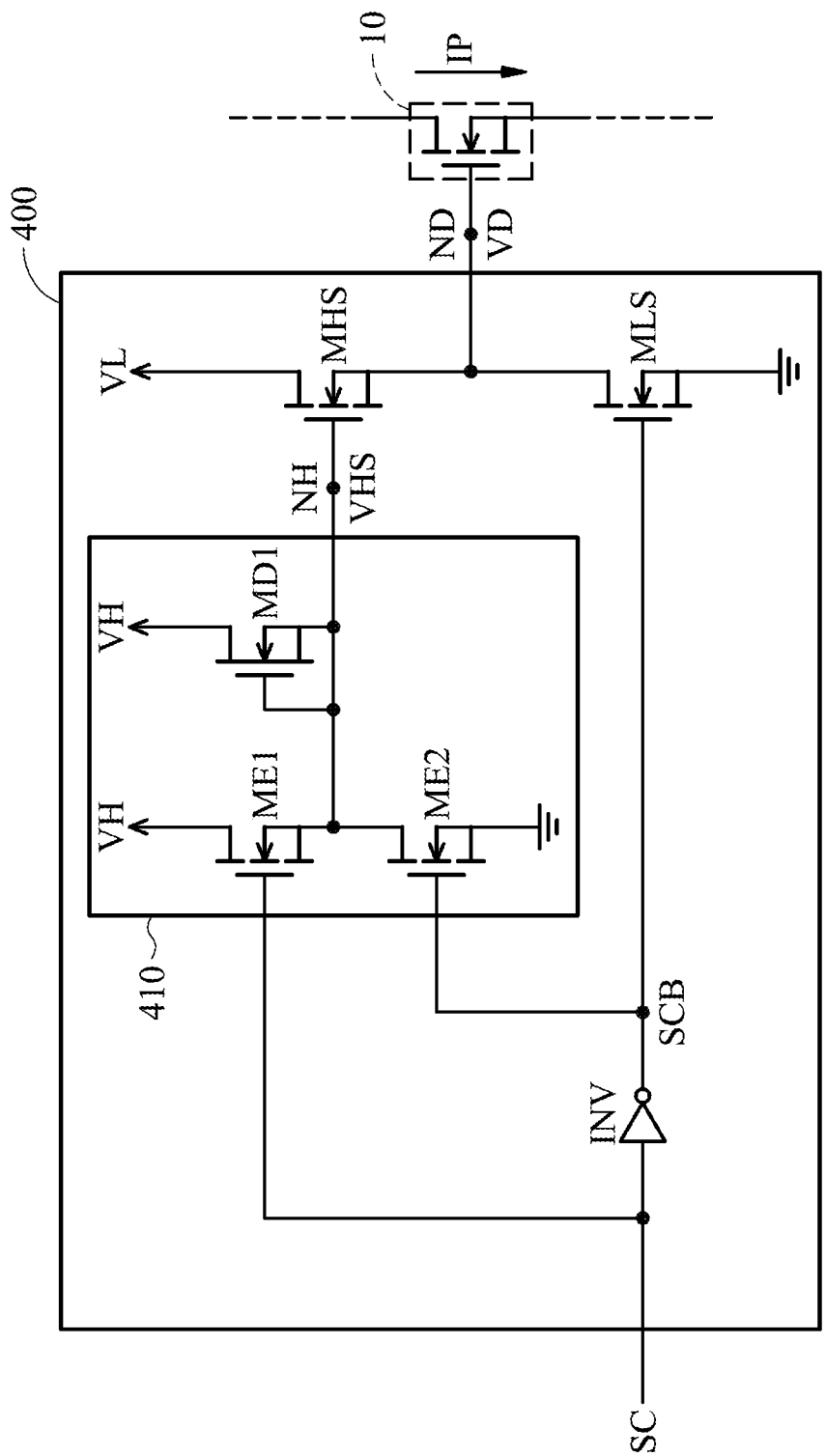
FIG. 4 is a schematic diagram of the driver in FIG. 3 in accordance with another embodiment of the invention.

FIG. 4 is a schematic diagram of the driver in FIG. 3 in accordance with an embodiment of the invention. As shown in FIG. 4, the driver 400 includes the high-side transistor MHS, the low-side transistor MLS, a high-side driver 410, and an inverter INV. According to an embodiment of the invention, the high-side transistor MHS corresponds to the high-side transistor 121 in FIG. 1, and the low-side transistor MLS corresponds to the low-side transistor 122 in FIG. 1.

The high-side driver 410 includes a first normally-off transistor ME1, a second normally-off transistor ME2, and a first normally-on transistor MD1. The first normally-off transistor ME1 includes a source terminal, a gate terminal, and a drain terminal, in which the source terminal is coupled to the high-side node NH, the gate terminal receives the control signal SC, and the drain terminal is supplied by the high voltage VH.

The second normally-off transistor ME2 includes a source terminal, a gate terminal, and a drain terminal, in which the source terminal is coupled to the ground, the gate terminal receives the reverse control signal SCB generated by the inverter INV, and the drain terminal is coupled to the high-side node NH. According to an embodiment of the invention, the gate terminal of the low-side transistor MLS receives the reverse control signal SCB.

The first normally-on transistor MD1 includes a source terminal, a gate terminal, and a drain terminal, in which the source terminal and the gate terminal are both coupled to the high-side node NH and the drain terminal is supplied by the high voltage VH. According to an embodiment of the invention, the first normally-on transistor MD1 is configured to provide the high voltage VH to the high-side node NH, and the first normally-off transistor ME1 is configured to enhance the speed that the high-side voltage VHS reaches the high voltage VH.

Figure 5:
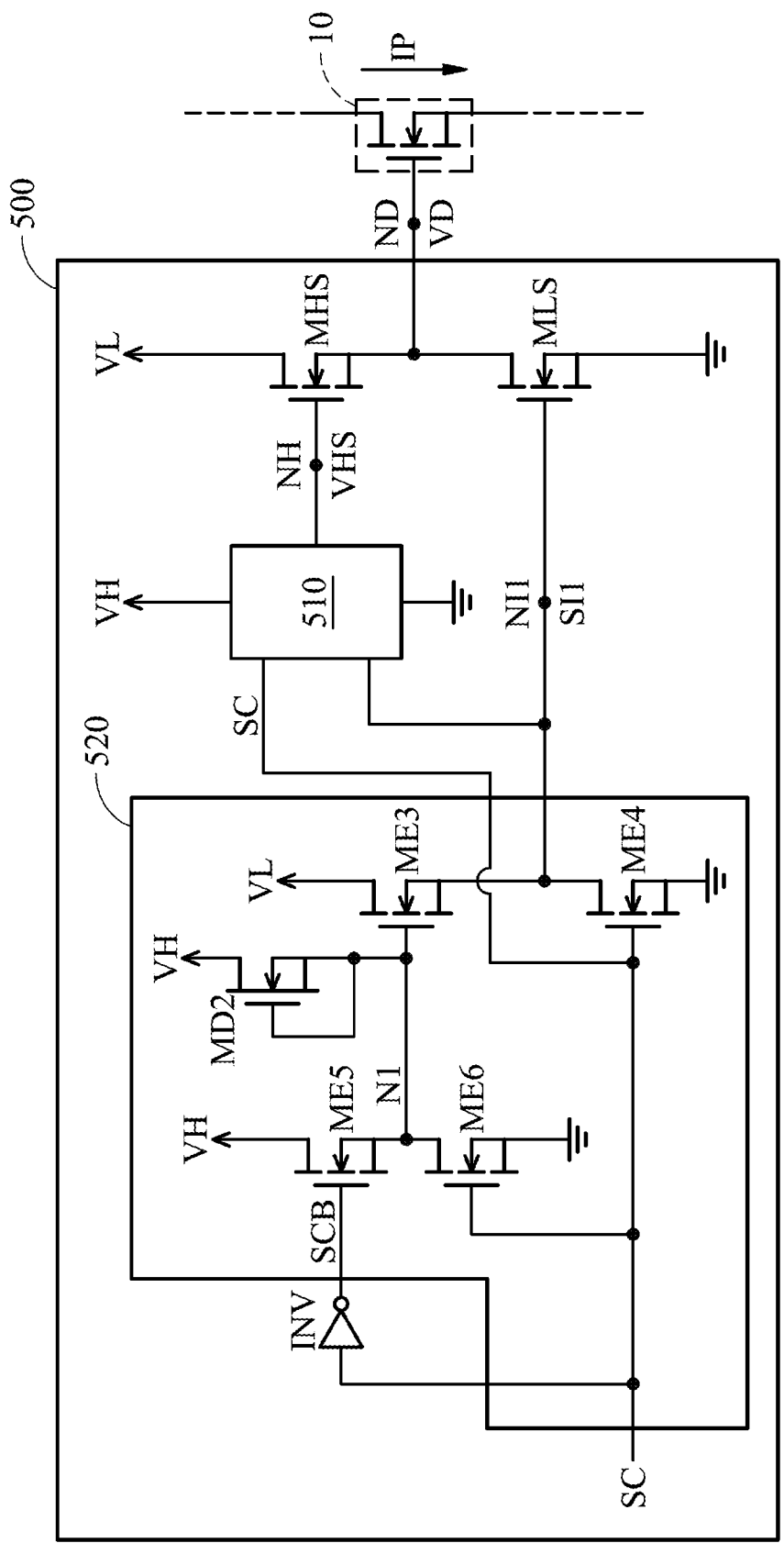
FIG. 5 is a schematic diagram of the driver in FIG. 3 in accordance with yet another embodiment of the invention.

FIG. 5 is a schematic diagram of the driver in FIG. 3 in accordance with yet another embodiment of the invention. As shown in FIG. 5, the driver 500 includes the high-side transistor MHS, the low-side transistor MLS, a high-side driver 510, a first pre-driver 520 and an inverter INV, which drives the power transistor 10 to sink a power current IP. According to an embodiment of the invention, the high-side driver 510 corresponds to the high-side driver 410 in FIG. 4.

The first pre-driver 520 is configured to generate a first internal signal SI1 at a first internal node NI1 according to the control signal SC and of the reverse control signal SCB, which includes a third normally-off transistor ME3, a fourth normally-off transistor ME4, a fifth normally-off transistor ME5, a second normally-on transistor MD2, and a sixth normally-off transistor ME6.

The third normally-off transistor ME3 includes a source terminal, a gate terminal, and a drain terminal, in which the source terminal is coupled to the first internal node NI1, the gate terminal is coupled to a first node N1, and the drain terminal is supplied by the low voltage VL.

The fourth normally-off transistor ME4 includes a source terminal, a gate terminal, and a drain terminal, in which the source terminal is coupled to the ground, the gate terminal receives the control signal SC, and the drain terminal is coupled to the first internal node NI1.

The fifth normally-off transistor ME5 includes a source terminal, a gate terminal, and a drain terminal, in which the source terminal is coupled to the first node N1, the gate terminal receives the reverse control signal SCB generated by the inverter INV, and the drain terminal is supplied by the high voltage VH.

The second normally-on transistor MD2 includes a source terminal, a gate terminal, and a drain terminal, in which the source terminal and the gate terminal are both coupled to the first node N1 and the drain terminal is supplied by the high voltage VH. According to an embodiment of the invention, the second normally-on transistor MD2 is configured to improve the current driving capability from high voltage VH to the first node N1.

According to an embodiment of the invention, the second normally-on transistor MD2 is configured to provide the high voltage VH to the first node N1, and the fifth normally-off transistor ME5 is configured to enhance the speed that the voltage of the first node N1 reaches the high voltage VH.

The sixth normally-off transistor ME6 includes a source terminal, a gate terminal, and a drain terminal, in which the source terminal is coupled to the ground, the gate terminal receives the control signal SC, and the drain terminal is coupled to the first node N1.

According to an embodiment of the invention, since the first internal signal SD is an inverse of the control signal SC, the high-side driver 510 generates the high-side voltage VHS at the high-side node NH according to the control signal SC and the first internal signal SI1.

Figure 6:
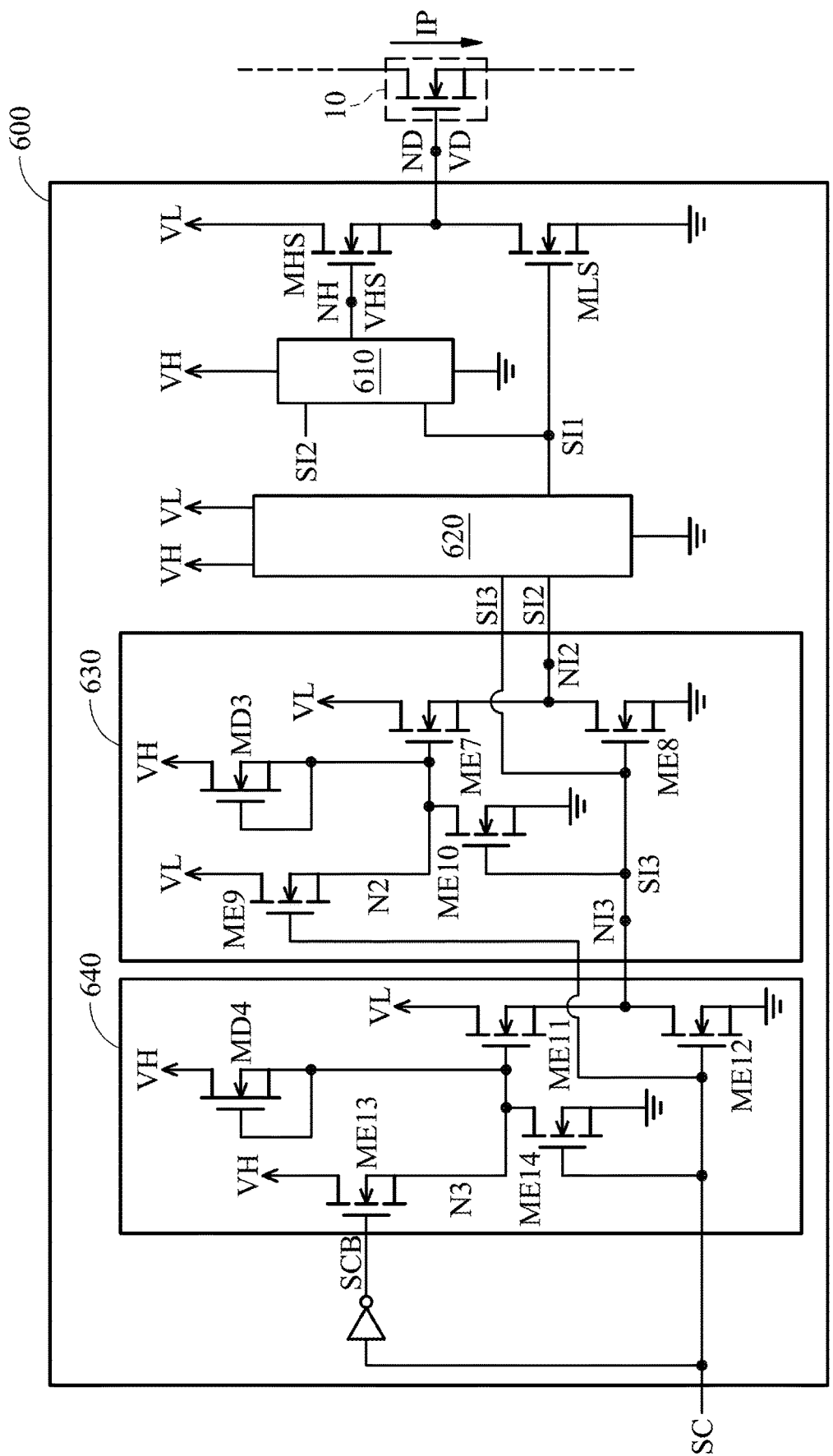
FIG. 6 is a schematic diagram of the driver in FIG. 3 in accordance with yet another embodiment of the invention.

FIG. 6 is a schematic diagram of the driver in FIG. 3 in accordance with yet another embodiment of the invention. As shown in FIG. 6, the driver 600 includes the high-side transistor MHS, the low-side transistor MLS, a high-side driver 610, a first pre-driver 620, a second pre-driver 630, a third pre-driver 640, and an inverter INV. The driver 600 generates the driving voltage VD at the driving node ND such that the power transistor 10 sinks a power current IP according to the driving voltage VD.

According to an embodiment of the invention, the high-side driver 610 corresponds to the high-side driver 410 in FIG. 4. According to an embodiment of the invention, the first pre-driver 620 corresponds to the first pre-driver 520 in FIG. 5, in which the second internal signal SI2 and the third internal signal S13 in FIG. 6 correspond to the control signal SC and the reverse control signal SCB in FIG. 5 respectively.

The second pre-driver 630 is configured to generate the second internal signal SI2 at a second internal node NI2 according to the third internal signal SI3 and the control signal SC, which includes a seventh normally-off transistor ME7, an eighth normally-off transistor ME8, a ninth normally-off transistor ME9, a third normally-on transistor MD3, and a tenth normally-off transistor ME10.

The seventh normally-off transistor ME7 includes a source terminal, a gate terminal, and a drain terminal, in which the source terminal is coupled to the second internal node NI2, the gate terminal is coupled to a second node N2, and the drain terminal is supplied by the low voltage VL.

The eighth normally-off transistor ME8 includes a source terminal, a gate terminal, and a drain terminal, in which the source terminal is coupled to the ground, the gate terminal receives the third internal signal SI3, and the drain terminal is coupled to the second internal node NI2.

The ninth normally-off transistor ME9 includes a source terminal, a gate terminal, and a drain terminal, in which the source terminal is coupled to the second node N2, the gate terminal receives the third internal signal SI3, and the drain terminal is supplied by the high voltage VH.

The third normally-on transistor MD3 includes a source terminal, a gate terminal, and a drain terminal, in which the source terminal and the gate terminal are both coupled to the second node N2 and the drain terminal is supplied by the high voltage VH. According to an embodiment of the invention, the third normally-on transistor MD3 is configured to provide the high voltage VH to the second node N2, and the ninth normally-off transistor ME9 is configured to enhance the speed that the voltage of the second node N2 reaches the high voltage VH.

The tenth normally-off transistor ME10 includes a source terminal, a gate terminal, and a drain terminal, in which the source terminal is coupled to the ground, the gate terminal receives the third internal signal SI3, and the drain terminal is coupled to the second node N2.

The third pre-driver 640 is configured to generate the third internal signal SI3 at a third internal node NI3 according to the control signal SC and the reverse control signal SCB generated by the inverter INV. The third pre-driver 640 includes an eleventh normally-off transistor ME11, a twelfth normally-off transistor ME12, a thirteenth normally-off transistor ME13, a fourth normally-on transistor MD4, and a fourteenth normally-off transistor ME14.

The eleventh normally-off transistor ME11 includes a source terminal, a gate terminal, and a drain terminal, in which the source terminal is coupled to the third internal node NI3, the gate terminal is coupled to a third node N3, and the drain terminal is supplied by the low voltage VL.

The twelfth normally-off transistor ME12 includes a source terminal, a gate terminal, and a drain terminal, in which the source terminal is coupled to the ground, the gate terminal receives the control signal SC, and the drain terminal is coupled to the third internal node SI3.

The thirteenth normally-off transistor ME13 includes a source terminal, a gate terminal, and a drain terminal, in which the source terminal is coupled to the third node N3, the gate terminal receives the reverse control signal SCB generated by the inverter INV, and the drain terminal is supplied by the high voltage VH.

The fourth normally-on transistor MD4 includes a source terminal, a gate terminal, and a drain terminal, in which the source terminal and the gate terminal are both coupled to the third node N3 and the drain terminal is supplied by the high voltage VH. According to an embodiment of the invention, the fourth normally-on transistor MD4 is configured to provide the high voltage VH to the third node N3, and the thirteenth normally-off transistor ME13 is configured to enhance the speed that the voltage of the third node N3 reaches the high voltage VH.

The fourteenth normally-off transistor ME14 includes a source terminal, a gate terminal, and a drain terminal, in which the source terminal is coupled to the ground, the gate terminal receives the control signal SC, and the drain terminal is coupled to the third node N3.

According to other embodiments of the invention, the driver 500 in FIG. 5, or the driver 600 in FIG. 6, may be cascaded with any even number of pre-drivers, which are identical to the first, second, and third pre-drivers in FIGS. 5 and 6, for improving the driving capability of the control signal SC.

Figure 7:
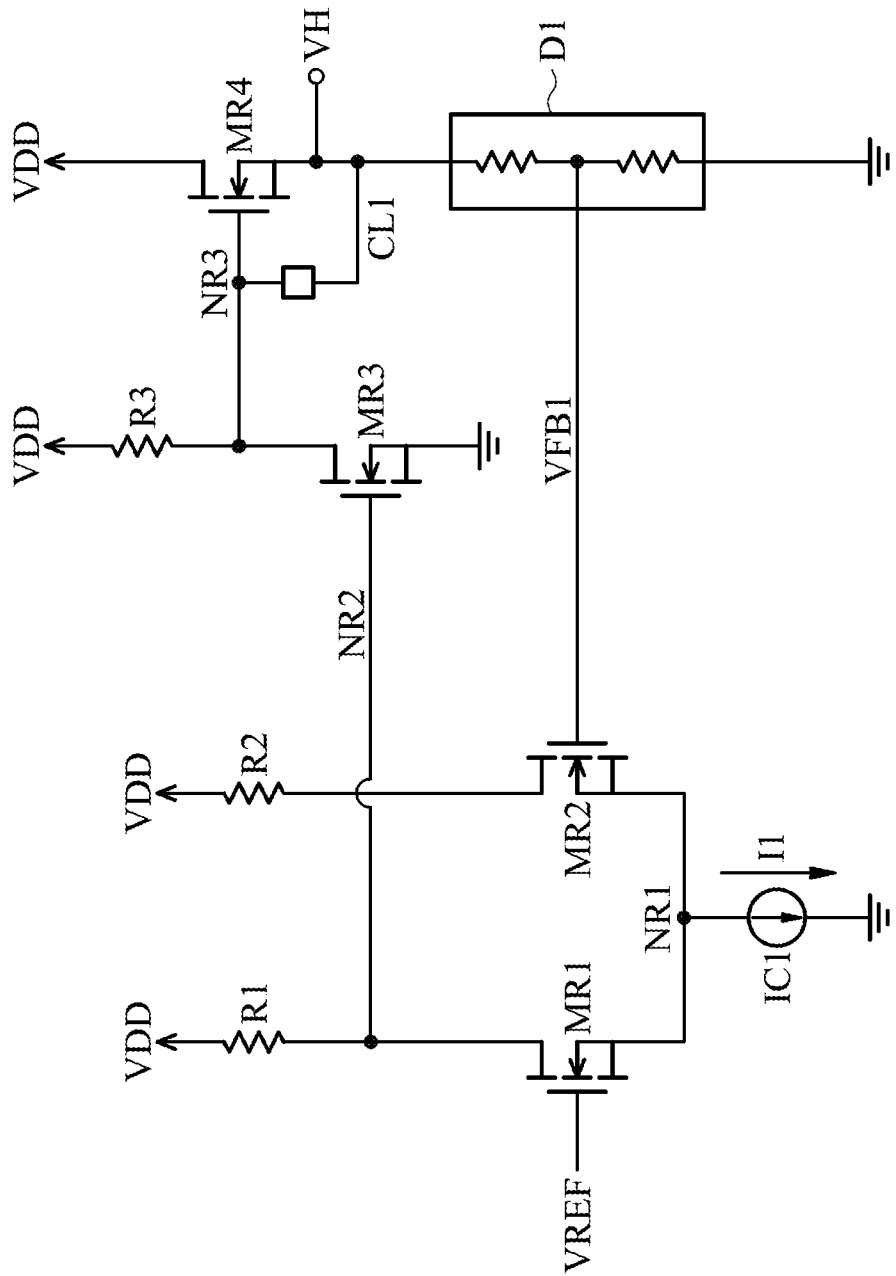
FIG. 7 is a schematic diagram of the first regulator in FIG. 3 in accordance with an embodiment of the invention.

FIG. 7 is a schematic diagram of the first regulator in FIG. 3 in accordance with an embodiment of the invention. As shown in FIG. 7, the first regulator 700 includes a first regulator normally-off transistor MR1, a first resistor R1, a second regulator normally-off transistor MR2, a second resistor R2, a first current source IC1, a third regulator normally-off transistor MR3, a third resistor R3, a fourth regulator normally-off transistor MR4, and a first voltage divider D1.

The first regulator normally-off transistor MR1 includes a source terminal, a gate terminal, and a drain terminal, in which the gate terminal receives a reference voltage VREF, the source terminal is coupled to a first regulator node NR1, and the drain terminal is coupled to the second regulator node NR2.

According to an embodiment of the invention, the reference voltage VREF may be generated by a bandgap circuit. According to another embodiment of the invention, the reference voltage VREF may be generated by a voltage divider dividing the supply voltage VDD with a factor. The first resistor R1 is coupled between the supply voltage VDD and the second regulator node NR2.

The second regulator normally-off transistor MR2 includes a source terminal, a gate terminal, and a drain terminal, in which the gate terminal receives a first feedback voltage VFB1 and the source terminal is coupled to the first regulator node NR1. The second resistor R2 is coupled between the supply voltage VDD and the drain terminal of the second regulator normally-off transistor MR2. The first current source IC1 sinks a first current I1 from the first regulator node NR1 to the ground.

The third regulator normally-off transistor MR3 includes a source terminal, a gate terminal, and a drain terminal, in which the gate terminal is coupled to the second regulator node NR2, the source terminal is coupled to the ground, and the drain terminal is coupled to a third regulator node NR3. The third resistor R3 is coupled between the supply voltage VDD and the third regulator node NR3.

The fourth regulator normally-off transistor MR4 includes a source terminal, a gate terminal, and a drain terminal, in which the gate terminal is coupled to the third regulator node NR3, the source terminal generates the high voltage VH, and the drain terminal is supplied by the supply voltage VDD.

The first voltage divider D1 divides the high voltage VH by a first factor to generate the first feedback voltage VFB1. According to an embodiment of the invention, the first voltage divider D1 includes two resistors in series such that the first factor is determined by the resistance ratio of the two resistors.

According to an embodiment of the invention, the first regulator 700 is configured to keep the first feedback voltage VFB1 be equal to the reference voltage VREF such that the high voltage VH is equal to the reference voltage VREF multiplied by the first factor determined by the first voltage divider D1.

According to an embodiment of the invention, the first regulator 700 further includes a first clamp circuit CL1. The first clamp circuit CL1 is configured to clamp a voltage between the gate terminal and the source terminal of the fourth regulator normally-off transistor MR4 under a breakdown voltage of the fourth regulator normally-off transistor MR4.

According to some embodiments of the invention, the first clamp circuit CL1 may include several diodes or diode-connected transistors cascaded in series such that the gate-to-source voltage of the fourth regulator normally-off transistor MR4 may not exceed the forward bias voltage of the cascaded diodes or diode-connected transistors.

Figure 8:
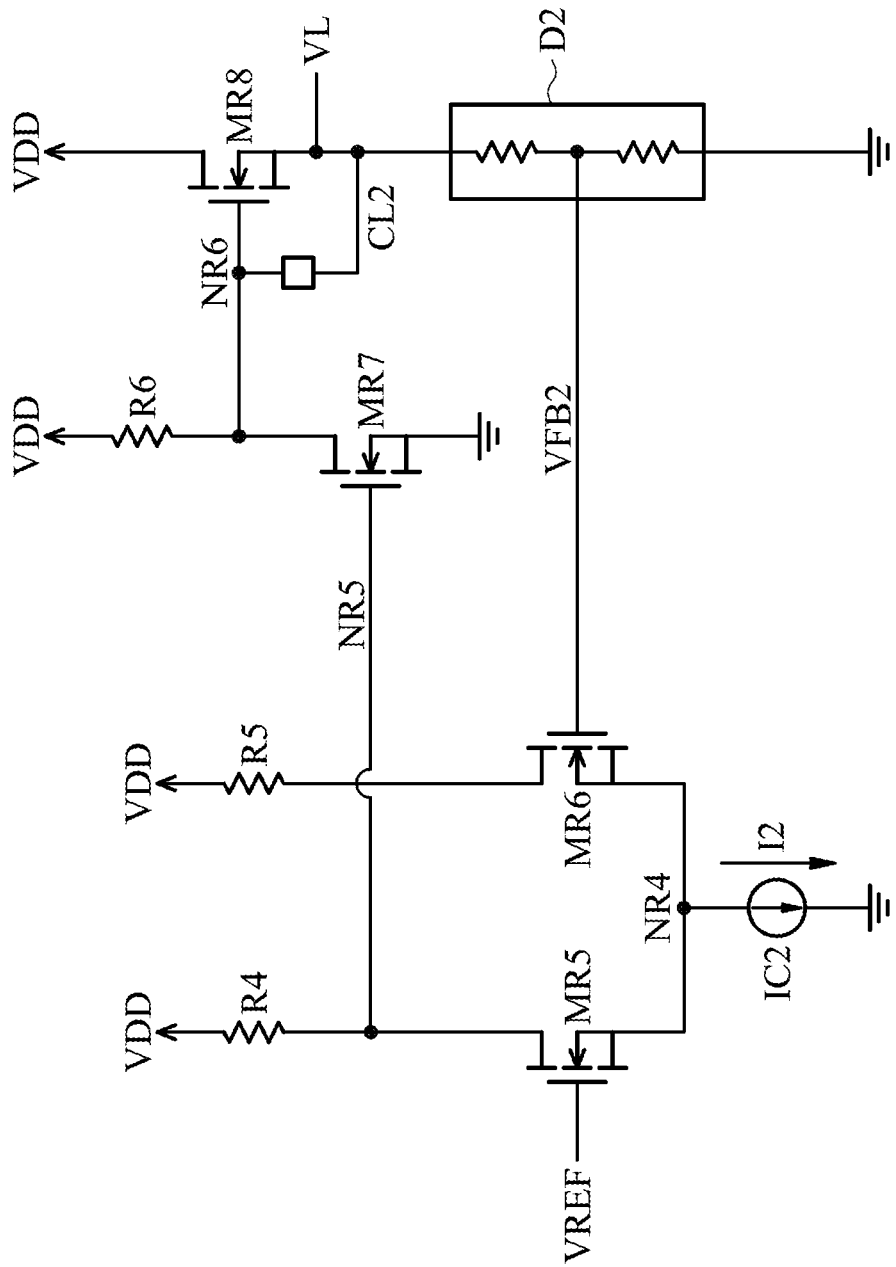
FIG. 8 is a schematic diagram of the second regulator in FIG. 3 in accordance with an embodiment of the invention.

FIG. 8 is a schematic diagram of the second regulator in FIG. 3 in accordance with an embodiment of the invention. As shown in FIG. 8, the second regulator 800 includes a fifth regulator normally-off transistor MR5, a fourth resistor R4, a sixth regulator normally-off transistor MR6, a fifth resistor R5, a second current source IC2, a seventh normally-off transistor MR7, a sixth resistor R6, an eighth normally-off transistor MR8, and a second voltage divider D2.

The fifth regulator normally-off transistor MR5 includes a source terminal, a gate terminal, and a drain terminal, in which the gate terminal receives a reference voltage VREF, the source terminal is coupled to a fourth regulator node NR4, and the drain terminal is coupled to the fifth regulator node NR5. The fourth resistor R4 is coupled between the supply voltage VDD and the second regulator node NR2.

The sixth regulator normally-off transistor MR6 includes a source terminal, a gate terminal, and a drain terminal, in which the gate terminal receives a second feedback voltage VFB2 and the source terminal is coupled to the fourth regulator node NR4. The fifth resistor R5 is coupled between the supply voltage VDD and the drain terminal of the sixth regulator normally-off transistor MR6. The second current source IC2 sinking a second current I2 from the fourth regulator node NR4 to the ground.

The seventh normally-off transistor MR7 includes a source terminal, a gate terminal, and a drain terminal, in which the gate terminal is coupled to the fifth regulator node NR5, the source terminal is coupled to the ground, and the drain terminal is coupled to the a sixth regulator node NR6. The sixth resistor R6 is coupled between the supply voltage VDD and the sixth regulator node NR6.

The eighth normally-off transistor MR8 includes a source terminal, a gate terminal, and a drain terminal, in which the gate terminal is coupled to the sixth regulator node NR6, the source terminal generates the low voltage VL, and the drain terminal is supplied by the supply voltage VDD.

The second voltage divider D2 divides the low voltage VL by a second factor to generate the second feedback voltage VFB2. According to an embodiment of the invention, the second voltage divider D2 includes two resistors in series such that the second factor is determined by the resistance ratio of the two resistors.

According to an embodiment of the invention, the second regulator 800 is configured to keep the second feedback voltage VFB2 be equal to the reference voltage VREF such that the low voltage VL is equal to the reference voltage VREF multiplied by the second factor determined by the second voltage divider D2.

According to an embodiment of the invention, the second regulator 1000 further includes a second clamp circuit CL2. The second clamp circuit CL2 is configured to clamp a voltage between the gate terminal and the source terminal of the eighth regulator normally-off transistor MR8 under a breakdown voltage of the eighth regulator normally-off transistor MR8.

According to some embodiments of the invention, the second clamp circuit CL2 may include several diodes or diode-connected transistors cascaded in series such that the gate-to-source voltage of the eighth regulator normally-off transistor MR8 may not exceed the forward bias voltage of the cascaded diodes or diode-connected transistors.

Figure 9:
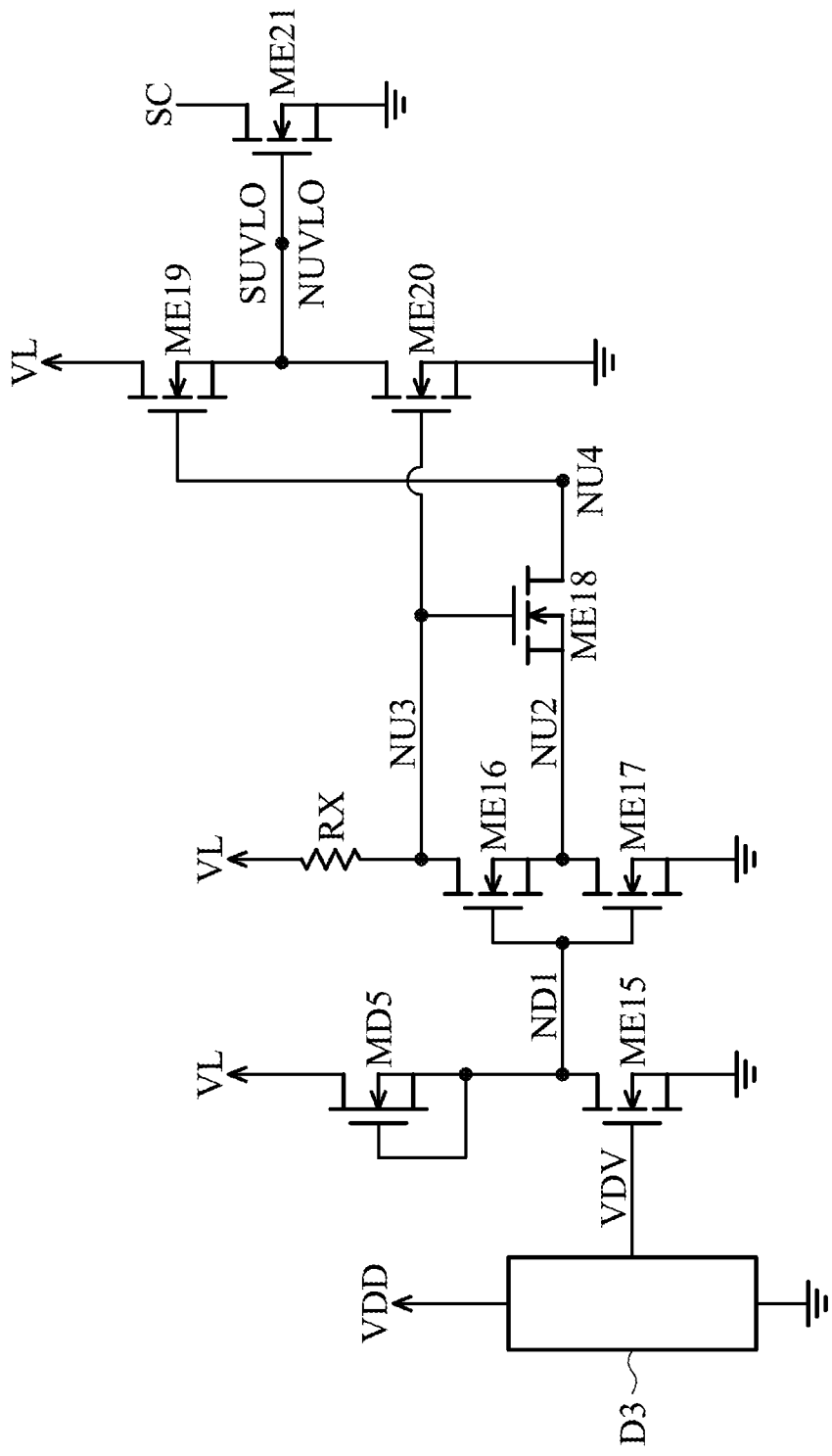
FIG. 9 is a schematic diagram of the UVLO circuit in FIG. 3 in accordance with an embodiment of the invention.

FIG. 9 is a schematic diagram of the UVLO circuit in FIG. 3 in accordance with an embodiment of the invention. As shown in FIG. 9, the UVLO circuit 900 includes a third voltage divider D3, a fifth normally-on transistor MD5, a fifteenth normally-off transistor ME15, a sixteenth normally-off transistor ME16, an under-voltage resistor RX, a seventeenth normally-off transistor ME17, an eighteenth normally-off transistor ME18, a nineteenth normally-off transistor ME19, a twentieth normally-off transistor ME20, and a twenty-first normally-off transistor ME21.

The third voltage divider D3 is configured to divide the supply voltage VDD by a third factor to generate a divided voltage VDV. According to an embodiment of the invention, the third voltage divider D3 is constructed by several resistors in series. According to another embodiment of the invention, the third voltage divider D3 is constructed by several diodes or diode-connected transistors in series.

The fifth normally-on transistor MD5 includes a source terminal, a gate terminal, and a drain terminal, in which the source terminal and the gate terminal are both coupled to a first under-voltage node NU1 and the drain terminal is supplied by the low voltage VL.

The fifteenth normally-off transistor ME15 includes a source terminal, a gate terminal, and a drain terminal, in which the source terminal is coupled to the ground, the gate terminal receives the divided voltage VDV, and the drain is coupled to the first under-voltage node NU1.

The sixteenth normally-off transistor ME16 includes a source terminal, a gate terminal, and a drain terminal, in which the source terminal is coupled to a second under-voltage node NU2, the gate terminal is coupled to the first under-voltage node NU1, and the drain is coupled to a third under-voltage node NU3. The under-voltage resistor RX is coupled between the low voltage VL and a third under-voltage node NU3.

The seventeenth normally-off transistor ME17 includes a source terminal, a gate terminal, and a drain terminal, in which the source terminal is coupled to the ground, the gate terminal is coupled to the first under-voltage node NU1, and the drain is coupled to the second under-voltage node NU2.

The eighteenth normally-off transistor ME18 includes a source terminal, a gate terminal, and a drain terminal, in which the source terminal is coupled to the second under-voltage node NU2, the gate terminal is coupled to the third under-voltage node NU3, and the drain is coupled to a fourth under-voltage node NU4.

The nineteenth normally-off transistor ME19 includes a source terminal, a gate terminal, and a drain terminal, in which the source terminal is coupled to an under-voltage lockout node NUVLO, the gate terminal is coupled to the fourth under-voltage node NU4, and the drain is supplied by the low voltage VL.

The twentieth normally-off transistor ME20 includes a source terminal, a gate terminal, and a drain terminal, in which the source terminal is coupled to the ground, the gate terminal is coupled to the third under-voltage node NU3, and the drain is coupled to the under-voltage lockout node NUVLO. The under-voltage lockout signal SUVLO is generated at the under-voltage lockout node NUVLO.

The twenty-first normally-off transistor ME21 includes a source terminal, a gate terminal, and a drain terminal, in which the source terminal is coupled to the ground, the gate terminal is coupled to the under-voltage lockout node NUVLO, and the drain is coupled to the control signal SC. The twenty-first normally-off transistor ME21 pulls the control signal SC to the ground according to the under-voltage lockout signal SUVLO.

According to an embodiment of the invention, it is assumed that the third factor generated by the third voltage divider D3 is 2/7 and that the threshold of the fifteenth normally-off transistor ME15 is 2V, the under-voltage lockout signal SUVLO is in the low logic level when the supply voltage VDD exceeds 7V. Therefore, the control signal SC drive the driver 323 in FIG. 3 to trigger the power transistor 10 sinking the power current IP. Those values illustrated above are merely for the purpose of explanation, but not intended to be limited thereto.

Figure 10:
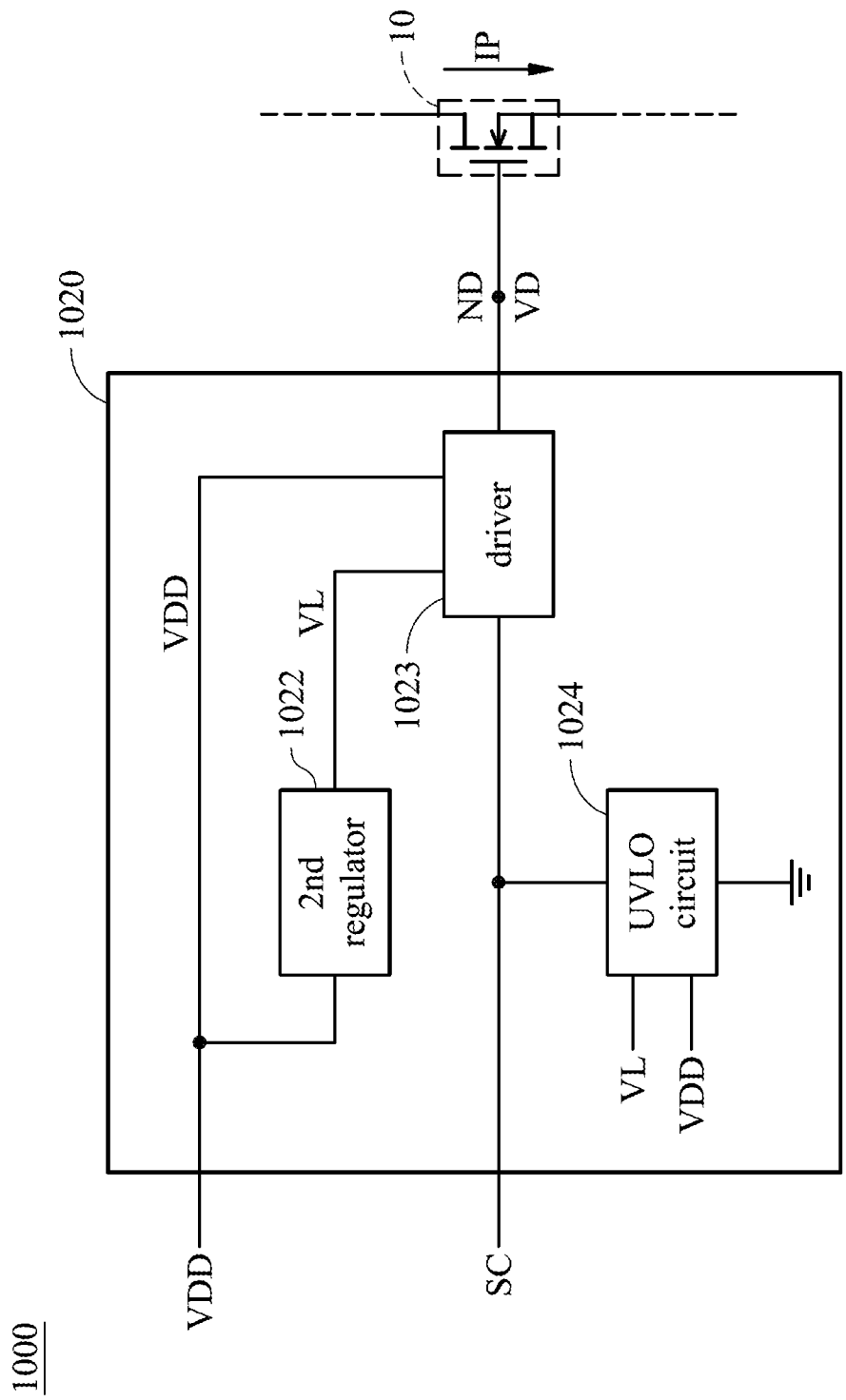
FIG. 10 is a block diagram of a power circuit in accordance with another embodiment of the invention.

FIG. 10 is a block diagram of a power circuit in accordance with another embodiment of the invention. The power circuit 1000, which is another embodiment of the power circuit 200 in FIG. 2, includes a power transistor 10 and a driving circuit 1020. According to an embodiment of the invention, the power transistor 10 is a GaN transistor.

As shown in FIG. 10, the driving circuit 1020 includes a second regulator 1022, a driver 1023, and an under-voltage lockout (UVLO hereafter) circuit 1024. Comparing FIG. 10 with FIG. 3, the driver 1023 in FIG. 10 is supplied by the supply voltage VDD and the low voltage VL generated by the second regulator 1022. In other words, the high voltage VH in FIG. 2 is directly supplied with the supply voltage VDD as shown in FIG. 10. According to an embodiment of the invention, the second regulator 1022 corresponds to the second regulator 322 in FIG. 3, and the UVLO circuit 1024 corresponds to the UVLO circuit 324 in FIG. 3. According to an embodiment of the invention, the UVLO circuit 900 in FIG. 9 illustrates an embodiment of the UVLO circuit 1024 in FIG. 10.

Figure 11:
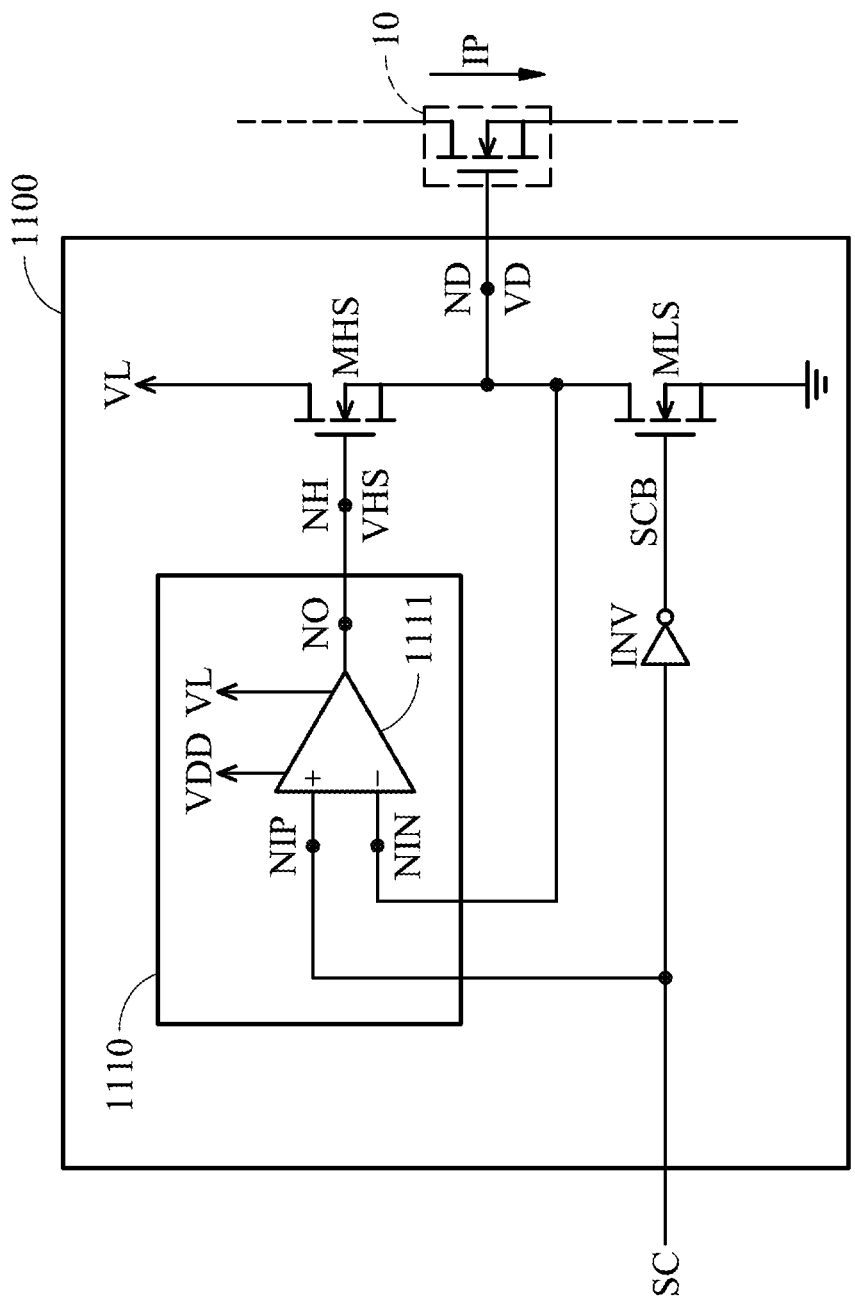
FIG. 11 is a schematic diagram of the driver in FIG. 10 in accordance with an embodiment of the invention.

FIG. 11 is a schematic diagram of the driver in FIG. 10 in accordance with an embodiment of the invention. As shown in FIG. 11, the driver 1100 includes the high-side transistor MHS, the low-side transistor MLS, a high-side driver 1110, and an inverter INV, in which the high-side driver 1110 includes a differential amplifier 1111.

The differential amplifier 1111 includes a positive input node NIP, a negative input node NIN, and an output node NO. The positive input node NIP receives the control signal SC, and the negative input node NIN is coupled to the driving node ND. The differential amplifier 1111 compares the control signal SC of the positive input node NIP to the driving voltage VD of the driving node ND to generate the high-side voltage VHS at the output node NO, such that the high-side transistor MHS is fully turned ON according to the high-side voltage VHS. When the high-side transistor MHS is fully turned ON, the driving voltage VD is equal to the low voltage VL.

Figure 12:
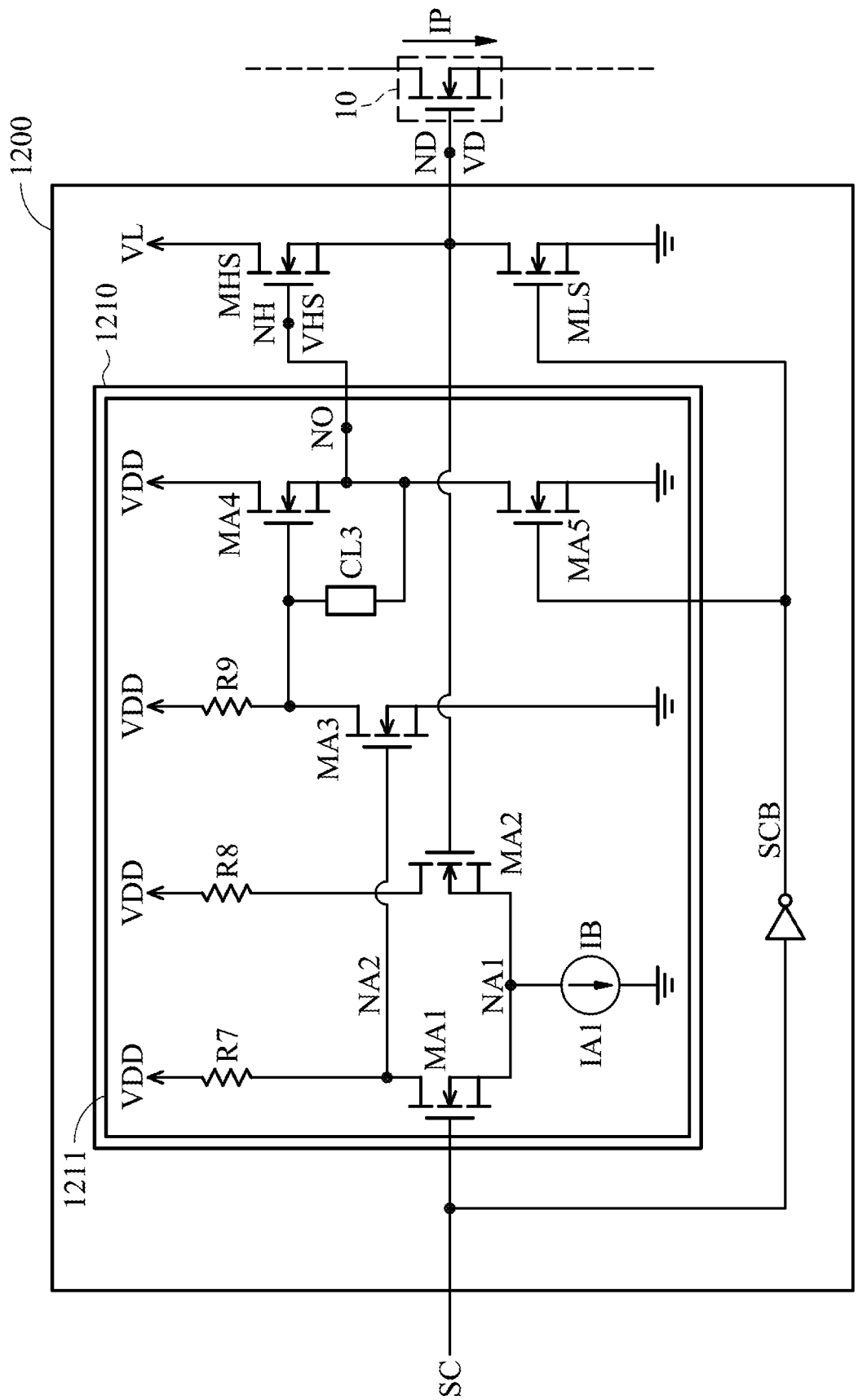
FIG. 12 is a schematic diagram of the driver in FIG. 11 in accordance with an embodiment of the invention.

FIG. 12 is a schematic diagram of the driver in FIG. 10 in accordance with an embodiment of the invention. As shown in FIG. 12, the driver 1200 includes the high-side transistor MHS, the low-side transistor MLS, a high-side driver 1210, and an inverter INV, in which the high-side driver 1210 includes a differential amplifier 1211. Comparing FIG. 12 with FIG. 10, the differential amplifier 1211 corresponds to the differential amplifier 1011.

The differential amplifier 1211 includes a first amplifier normally-off transistor MA1, a seventh resistor R7, a second amplifier normally-off transistor MA2, an eighth resistor R8, an amplifier current source IA1 a third amplifier normally-off transistor MA3, a ninth resistor R9, a fourth amplifier normally-off transistor MA4, and a fifth amplifier normally-off transistor MA5.

The first amplifier normally-off transistor MA1 includes a source terminal, a gate terminal, and a drain terminal, in which the gate terminal receives the control signal SC, the source terminal is coupled to a first amplifier node NA1, the drain terminal is coupled to a second amplifier node NA2. The seventh resistor R7 is coupled between the supply voltage VDD and the second amplifier node NA2.

The second amplifier normally-off transistor MA2 includes a source terminal, a gate terminal, and a drain terminal, in which the gate terminal is coupled to the driving node ND, and the source terminal is coupled to the first amplifier node NA1. The eighth resistor R8 is coupled between the supply voltage VDD and the drain terminal of the second amplifier normally-off transistor MA2. The amplifier current source IA1 sinks a bias current IB from the first amplifier node NA1 to the ground.

The third amplifier normally-off transistor MA3 includes a source terminal, a gate terminal, and a drain terminal, in which the gate terminal is coupled to the second amplifier node NA2, the source terminal is coupled to the ground, and the drain terminal is coupled to a third amplifier node NA3. The ninth resistor R9 is coupled between the supply voltage VDD and the third amplifier node NA3.

The fourth amplifier normally-off transistor MA4 includes a source terminal, a gate terminal, and a drain terminal, in which the gate terminal is coupled to the third amplifier node NA3, the source terminal is coupled to the output node NO, which is coupled to the high-side node NH, and the drain terminal is supplied by the supply voltage VDD.

The fifth amplifier normally-off transistor MA5 includes a source terminal, a gate terminal, and a drain terminal, in which the gate terminal receives the reverse control signal SCB, the source terminal is coupled to the ground, and the drain terminal is coupled to the output node NO of the differential amplifier 1211.

According to an embodiment of the invention, the differential amplifier 1211 further includes a third clamp circuit CL3. The third clamp circuit CL3 is configured to clamp a gate-to-source voltage of the fourth amplifier normally-off transistor MA4 under a breakdown voltage of the fourth amplifier normally-off transistor MA4. Therefore, the fourth amplifier normally-off transistor MA4 is protected from breakdown by the third clamp circuit CL3.

According to some embodiments of the invention, the third clamp circuit CL3 may include several diodes or diode-connected transistors cascaded in series such that the gate-to-source voltage of the fourth amplifier normally-off transistor MA4 may not exceed the forward bias voltage of the cascaded diodes or diode-connected transistors.

According to an embodiment of the invention, the control signal SC is in a high voltage level and the driving voltage VD is in a low voltage level relative to the control signal SC. The second amplifier node NA2 is pulled low by the first amplifier normally-off transistor MA1 such that the third amplifier normally-off transistor MA3 is turned OFF and the third amplifier node NA3 is pulled to the supply voltage VDD by the ninth resistor R9.

Then, the fourth amplifier normally-off transistor MA4 is turned ON by the voltage of the third amplifier node NA3, and the fifth amplifier normally-off transistor MA5 is turned OFF by the reverse control signal SCB. Therefore, the differential amplifier 1211 outputs the supply voltage VDD at the output node NO to turn ON the high-side transistor MHS.

According to another embodiment of the invention, the control signal SC is in the low voltage level. Since the fifth amplifier normally-off transistor MA5 is turned ON by the reverse control signal SCB, which is in the high voltage level when the control signal SC is in the low voltage level, the output node NO of the differential amplifier 1211 is pulled down to the ground. Therefore, the high-side transistor MHS is turned OFF and the low-side transistor MLS is turned ON by the reverse control signal SCB.

Figure 13:
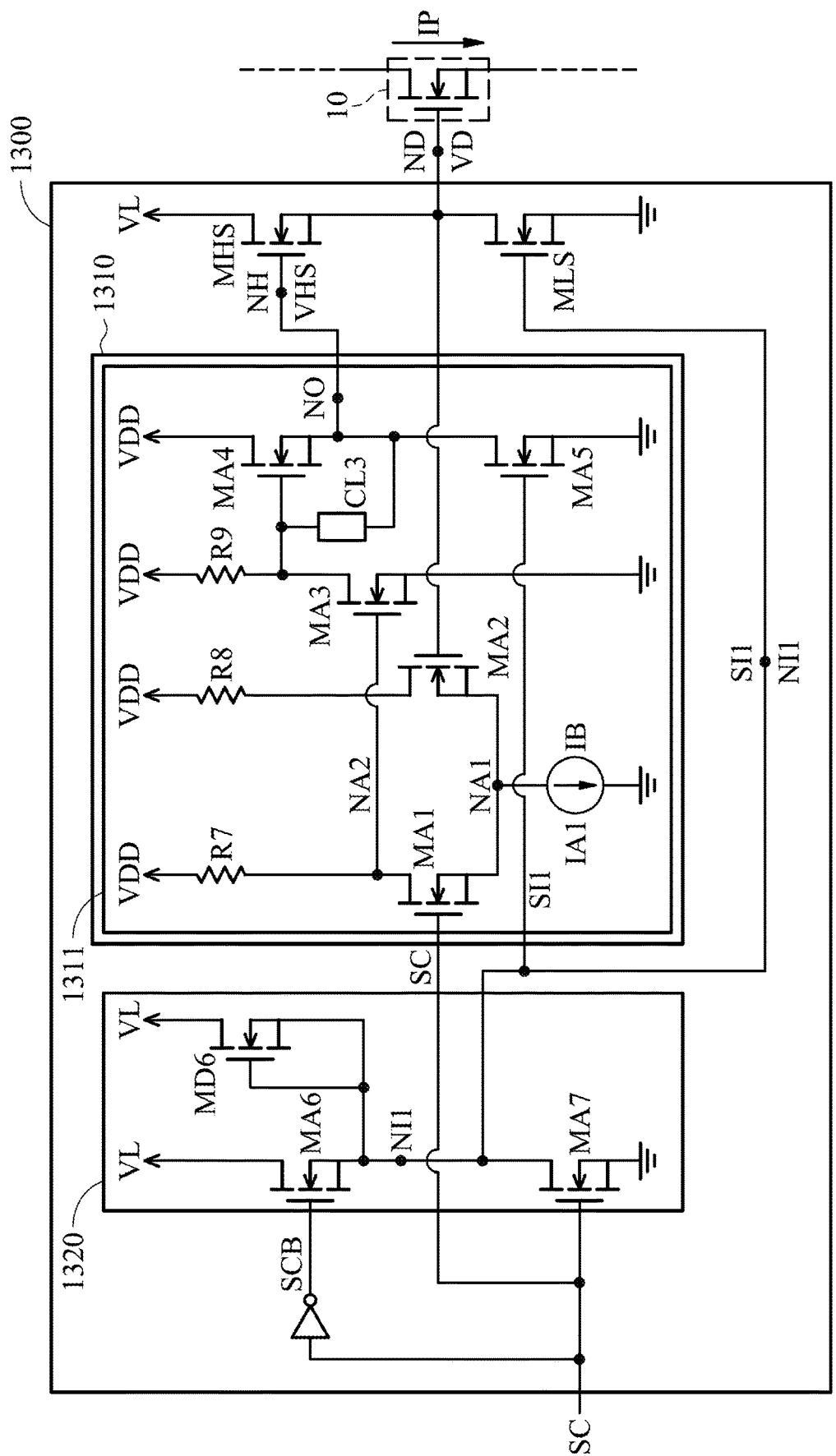
FIG. 13 is a schematic diagram of the driver in FIG. 11 in accordance with another embodiment of the invention.

FIG. 13 is a schematic diagram of the driver in FIG. 10 in accordance with another embodiment of the invention. As shown in FIG. 13, the driver 1300 includes a high-side driver 1310, which includes a differential amplifier 1311, and a first pre-driver 1320.

According to an embodiment of the invention, the differential amplifier 1311 is identical to the differential amplifier 1211 in FIG. 12. The first pre-driver 1320 generates the first internal signal SI1 at the first internal node NI1 according to the control signal SC and the reverse control signal SCB for improving the driving capability of the control signal SC.

The first pre-driver 1320 includes a sixth amplifier normally-off transistor MA6, a sixth normally-on transistor MD6, and a seventh amplifier normally-off transistor MA7.

The sixth amplifier normally-off transistor MA6 includes a source terminal, a gate terminal, and a drain terminal, in which the source terminal is coupled to the first internal node NI1, the gate terminal receives the reverse control signal SCB generated by the inverter INV, and the drain terminal is supplied by the low voltage VL.

The sixth normally-on transistor MD6 includes a source terminal, a gate terminal, and a drain terminal, in which the source terminal and the gate terminal are both coupled to a first internal node NI1 and the drain terminal is supplied by the low voltage VL. According to an embodiment of the invention, the sixth normally-on transistor MD6 is configured to improve the current driving capability from low voltage VL to the first internal node NI1.

The seventh amplifier normally-off transistor MA7 includes a source terminal, a gate terminal, and a drain terminal, in which the source terminal is coupled to the ground, the gate terminal receives the control signal SC, and the drain terminal is coupled to the first node N1.

Figure 14:
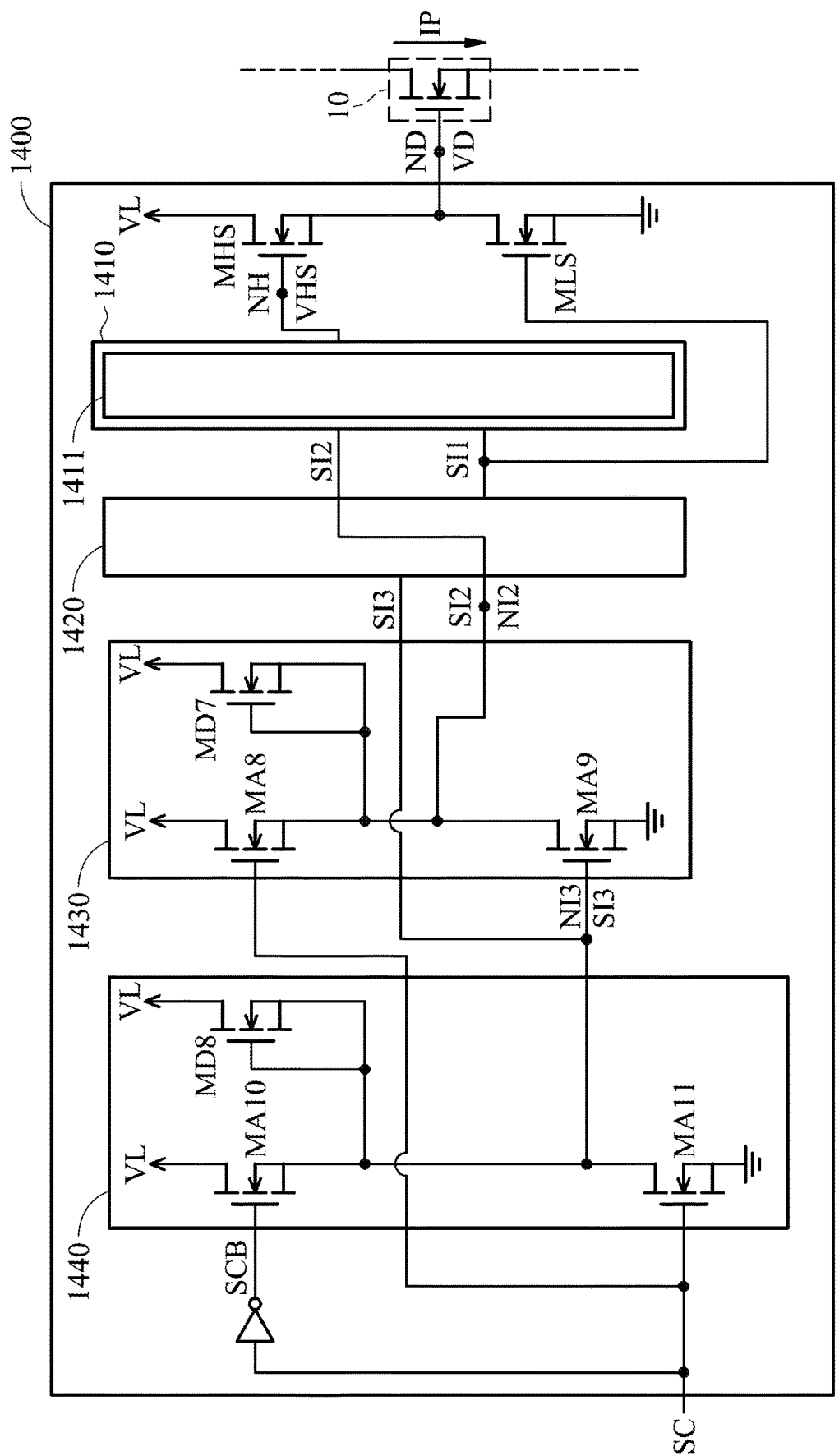
FIG. 14 is a schematic diagram of the driver in FIG. 11 in accordance with another embodiment of the invention.

FIG. 14 is a schematic diagram of the driver in FIG. 11 in accordance with another embodiment of the invention. As shown in FIG. 14, the driver 1400 includes a high-side driver 1410, which includes a differential amplifier 1411, a first pre-driver 1420, a second pre-driver 1430, and a third pre-driver 1440. According to an embodiment of the invention, the high-side driver 1410 corresponds to the high-side driver 1210 in FIG. 12, and the differential amplifier 1411 corresponds to the differential amplifier 1211 in FIG. 12. According to an embodiment of the invention, the second pre-driver 1430, and a third pre-driver 1440 are configured to improve the driving capability of the control signal SC.

According to another embodiment of the invention, the first pre-driver 1420 corresponds to the first pre-driver 1320 in FIG. 13. The second pre-driver 1430 generates a second internal signal S12 at the second internal node N12 according to a third internal signal S13 and the control signal SC. As shown in FIG. 14, the second pre-driver 1430 includes an eighth amplifier normally-off transistor MA8, a seventh normally-on transistor MD7, and a ninth amplifier normally-off transistor MA9.

The eighth amplifier normally-off transistor MA8 includes a source terminal, a gate terminal, and a drain terminal, in which the source terminal is coupled to the second internal node N12, the gate terminal receives the control signal SC, and the drain terminal is supplied by the low voltage VL.

The seventh normally-on transistor MD7 includes a source terminal, a gate terminal, and a drain terminal, in which the source terminal and the gate terminal are both coupled to the second internal node N12 and the drain terminal is supplied by the low voltage VL. According to an embodiment of the invention, the seventh normally-on transistor MD7 is configured to provide the low voltage VL to the second internal node N12, and the eighth amplifier normally-off transistor MA8 is configured to enhance the speed that the voltage of the second internal node N12 reaches the low voltage VL.

The ninth amplifier normally-off transistor MA9 includes a source terminal, a gate terminal, and a drain terminal, in which the source terminal is coupled to the ground, the gate terminal is coupled to the third internal node N13 to receive the third internal signal S13, and the drain terminal is coupled to the second internal node N12.

The third pre-driver 1440 generates the third internal signal S13 at the third internal node N13 according to the control signal SC and the reverse control signal SCB. As shown in FIG. 14, the third pre-driver 1440 includes a tenth amplifier normally-off transistor MA10, an eighth normally-on transistor MD8, and a eleventh amplifier normally-off transistor MA11.

The tenth amplifier normally-off transistor MA10 includes a source terminal, a gate terminal, and a drain terminal, in which the source terminal is coupled to the third internal node NI3, the gate terminal receives the reverse control signal SCB generated by the inverter INV, and the drain terminal is supplied by the low voltage VL.

The eighth normally-on transistor MD8 includes a source terminal, a gate terminal, and a drain terminal, in which the source terminal and the gate terminal are both coupled to the third internal node NI3 and the drain terminal is supplied by the low voltage VL. According to an embodiment of the invention, the eighth normally-on transistor MD8 is configured to improve the current driving capability from low voltage VL to the third internal node NI3.

The eleventh amplifier normally-off transistor MA11 includes a source terminal, a gate terminal, and a drain terminal, in which the source terminal is coupled to the ground, the gate terminal receives the control signal SC, and the drain terminal is coupled to the third internal node NI3.

According to other embodiments of the invention, the driver 1400 in FIG. 14 may be further cascaded with any even number of pre-drivers, which are identical to the first, second, and third pre-drivers in FIG. 13-14, for improving the driving capability of the control signal SC.

Comparing FIGS. 3-6 with FIGS. 10-14, since the first regulator 321 in FIG. 3 is moved into the high-side driver, the first, second, and third pre-drivers in FIGS. 5-6 can be simplified to be those in FIGS. 13-14.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A power circuit, comprising:
   a power transistor, sinking a power current to a ground according to a driving voltage of a driving node; and
   a driving circuit, comprising:
      a driver, comprising:
         a high-side transistor, providing a low voltage to the driving node according to a high-side voltage of a high-side node;
         a low-side transistor, coupling the driving node to the ground according to a control signal; and
         a high-side driver, comprising a plurality of N-type transistors and providing a high voltage to the high-side node according to the control signal, wherein the high voltage exceeds an operational gate voltage of the N-type transistors in the driving circuit;
         a first pre-driver, generating a first internal signal at a first internal node according to the control signal and an inverse of the control signal, wherein the high-side driver provides the high voltage to the high-side node according to the control signal and the first internal signal;
         a second pre-driver, generating a second internal signal at a second internal node according to a third internal signal and the control signal; and
         a third pre-driver, generating a third internal signal at a third internal node according to the control signal and the inverse of the control signal;
         wherein the first pre-driver generates the first internal signal according to the second internal signal and the third internal signal; and
      a second regulator, down-converting a supply voltage to the low voltage.

2. The power circuit of claim 1, wherein the power transistor is a GaN transistor.

3. The power circuit of claim 1, wherein the driving circuit further comprises:
   a first regulator, down-converting the supply voltage to the high voltage, wherein the low voltage is lower than the high voltage.

4. The power circuit of claim 3, wherein the first regulator comprises:
   a first regulator normally-off transistor, comprising a source terminal, a gate terminal, and a drain terminal, wherein the gate terminal receives a reference voltage, the source terminal is coupled to a first regulator node, and the drain terminal is coupled to the second regulator node;
   a first resistor, coupled between the supply voltage and the second regulator node;
   a second regulator normally-off transistor, comprising a source terminal, a gate terminal, and a drain terminal, wherein the gate terminal receives a first feedback voltage and the source terminal is coupled to the first regulator node;
   a second resistor, coupled between the supply voltage and the drain terminal of the second regulator normally-off transistor;
   a first current source, sinking a first current from the first regulator node to the ground;
   a third regulator normally-off transistor, comprising a source terminal, a gate terminal, and a drain terminal, wherein the gate terminal is coupled to the second regulator node, the source terminal is coupled to the ground, and the drain terminal is coupled to a third regulator node;
   a third resistor, coupled between the supply voltage and the third regulator node;
   a fourth regulator normally-off transistor, comprising a source terminal, a gate terminal, and a drain terminal, wherein the gate terminal is coupled to the third regulator node, the source terminal generates the high voltage, and the drain terminal is supplied by the supply voltage; and
   a first voltage divider, dividing the high voltage by a first factor to generate the first feedback voltage.

5. The power circuit of claim 4, wherein the first regulator further comprises:
   a first clamp circuit, configured to clamp a voltage between the gate terminal and the source terminal of the fourth regulator normally-off transistor under a breakdown voltage of the fourth regulator normally-off transistor.

6. The power circuit of claim 3, wherein the high-side driver comprises:
   a first normally-off transistor, comprising a source terminal, a gate terminal, and a drain terminal, wherein the source terminal is coupled to the high-side node, the gate terminal receives the control signal, and the drain terminal is supplied by the high voltage;

a first normally-on transistor, comprising a source terminal, a gate terminal, and a drain terminal, wherein the source terminal and the gate terminal are both coupled to the high-side node and the drain terminal is supplied by the high voltage; and a second normally-off transistor, comprising a source terminal, a gate terminal, and a drain terminal, wherein the source terminal is coupled to the ground, the gate terminal receives the first internal signal, and the drain terminal is coupled to the high-side node.

7. The power circuit of claim 1, wherein the first pre-driver comprises:

a third normally-off transistor, comprising a source terminal, a gate terminal, and a drain terminal, wherein the source terminal is coupled to the first internal node, the gate terminal is coupled to a first node, and the drain terminal is supplied by the low voltage;

a fourth normally-off transistor, comprising a source terminal, a gate terminal, and a drain terminal, wherein the source terminal is coupled to the ground, the gate terminal receives the control signal, and the drain terminal is coupled to the first internal node;

a fifth normally-off transistor, comprising a source terminal, a gate terminal, and a drain terminal, wherein the source terminal is coupled to the first node, the gate terminal receives the inverse of the control signal, and the drain terminal is supplied by the high voltage;

a second normally-on transistor, comprising a source terminal, a gate terminal, and a drain terminal, wherein the source terminal and the gate terminal are both coupled to the first node and the drain terminal is supplied by the high voltage; and a sixth normally-off transistor, comprising a source terminal, a gate terminal, and a drain terminal, wherein the source terminal is coupled to the ground, the gate terminal receives the control signal, and the drain terminal is coupled to the first node.

8. The power circuit of claim 1, wherein the second pre-driver comprises:

a seventh normally-off transistor, comprising a source terminal, a gate terminal, and a drain terminal, wherein the source terminal is coupled to the second internal node, the gate terminal is coupled to a second node, and the drain terminal is supplied by the low voltage;

an eighth normally-off transistor, comprising a source terminal, a gate terminal, and a drain terminal, wherein the source terminal is coupled to the ground, the gate terminal receives the third internal signal, and the drain terminal is coupled to the second internal node;

a ninth normally-off transistor, comprising a source terminal, a gate terminal, and a drain terminal, wherein the source terminal is coupled to the second node, the gate terminal receives the third internal signal, and the drain terminal is supplied by the high voltage;

a third normally-on transistor, comprising a source terminal, a gate terminal, and a drain terminal, wherein the source terminal and the gate terminal are both coupled to the second node and the drain terminal is supplied by the high voltage; and a tenth normally-off transistor, comprising a source terminal, a gate terminal, and a drain terminal, wherein the source terminal is coupled to the ground, the gate terminal receives the third internal signal, and the drain terminal is coupled to the second node.

9. The power circuit of claim 8, wherein the third pre-driver comprises:

an eleventh normally-off transistor, comprising a source terminal, a gate terminal, and a drain terminal, wherein the source terminal is coupled to the third internal node, the gate terminal is coupled to a third node, and the drain terminal is supplied by the low voltage;

a twelfth normally-off transistor, comprising a source terminal, a gate terminal, and a drain terminal, wherein the source terminal is coupled to the ground, the gate terminal receives the control signal, and the drain terminal is coupled to the third internal node;

a thirteenth normally-off transistor, comprising a source terminal, a gate terminal, and a drain terminal, wherein the source terminal is coupled to the third node, the gate terminal receives the inverse of the control signal, and the drain terminal is supplied by the high voltage;

a fourth normally-on transistor, comprising a source terminal, a gate terminal, and a drain terminal, wherein the source terminal and the gate terminal are both coupled to the third node and the drain terminal is supplied by the high voltage; and a fourteenth normally-off transistor, comprising a source terminal, a gate terminal, and a drain terminal, wherein the source terminal is coupled to the ground, the gate terminal receives the control signal, and the drain terminal is coupled to the third node.

10. The power circuit of claim 1, wherein the second regulator comprises:

a fifth regulator normally-off transistor, comprising a source terminal, a gate terminal, and a drain terminal, wherein the gate terminal receives a reference voltage, the source terminal is coupled to a fourth regulator node, and the drain terminal is coupled to the fifth regulator node;

a fourth resistor, coupled between the supply voltage and the second regulator node;

a sixth regulator normally-off transistor, comprising a source terminal, a gate terminal, and a drain terminal, wherein the gate terminal receives a second feedback voltage and the source terminal is coupled to the fourth regulator node;

a fifth resistor, coupled between the supply voltage and the drain terminal of the sixth regulator normally-off transistor;

a second current source, sinking a second current from the fourth regulator node to the ground;

a seventh normally-off transistor, comprising a source terminal, a gate terminal, and a drain terminal, wherein the gate terminal is coupled to the fifth regulator node, the source terminal is coupled to the ground, and the drain terminal is coupled to the a sixth regulator node;

a sixth resistor, coupled between the supply voltage and the sixth regulator node;

an eighth normally-off transistor, comprising a source terminal, a gate terminal, and a drain terminal, wherein the gate terminal is coupled to the sixth regulator node, the source terminal generates the low voltage, and the drain terminal is supplied by the supply voltage; and a second voltage divider, dividing the low voltage by a second factor to generate the second feedback voltage.

11. The power circuit of claim 10, wherein the second regulator further comprises:

a second clamp circuit, configured to clamp a voltage between the gate terminal and the source terminal of the eighth regulator normally-off transistor under a breakdown voltage of the eighth regulator normally-off transistor.

12. The power circuit of claim 1, wherein the driving circuit further comprises:
an under-voltage lockout circuit, supplied by the low voltage and pulling down the control signal to the ground when the supply voltage is less than a threshold.

13. The power circuit of claim 12, wherein the under-voltage lockout circuit comprises:
a third voltage divider, dividing the supply voltage to generate a divided voltage;
a fifth normally-on transistor, comprising a source terminal, a gate terminal, and a drain terminal, wherein the source terminal and the gate terminal are both coupled to a first under-voltage node and the drain terminal is supplied by the low voltage;
a fifteenth normally-off transistor, comprising a source terminal, a gate terminal, and a drain terminal, wherein the source terminal is coupled to the ground, the gate terminal receives the divided voltage, and the drain is coupled to the first under-voltage node;
a sixteenth normally-off transistor, comprising a source terminal, a gate terminal, and a drain terminal, wherein the source terminal is coupled to a second under-voltage node, the gate terminal is coupled to the first under-voltage node, and the drain is coupled to a third under-voltage node;
an under-voltage resistor, coupled between the low voltage and a third under-voltage node;
a seventeenth normally-off transistor, comprising a source terminal, a gate terminal, and a drain terminal, wherein the source terminal is coupled to the ground, the gate terminal is coupled to the first under-voltage node, and the drain is coupled to the second under-voltage node;
an eighteenth normally-off transistor, comprising a source terminal, a gate terminal, and a drain terminal, wherein the source terminal is coupled to the second under-voltage node, the gate terminal is coupled to the third under-voltage node, and the drain is coupled to a fourth under-voltage node;
a nineteenth normally-off transistor, comprising a source terminal, a gate terminal, and a drain terminal, wherein the source terminal is coupled to an under-voltage lockout node, the gate terminal is coupled to the fourth under-voltage node, and the drain is supplied by the low voltage;
a twentieth normally-off transistor, comprising a source terminal, a gate terminal, and a drain terminal, wherein the source terminal is coupled to the ground, the gate terminal is coupled to the third under-voltage node, and the drain is coupled to the under-voltage lockout node, wherein an under-voltage lockout signal is generated at the under-voltage lockout node; and
a twenty-first normally-off transistor, comprising a source terminal, a gate terminal, and a drain terminal, wherein the source terminal is coupled to the ground, the gate terminal is coupled to the under-voltage lockout node, and the drain is coupled to the control signal, wherein the twenty-first normally-off transistor pulls the control signal to the ground according to the under-voltage lockout signal.

14. A power circuit comprising:
a power transistor, sinking a power current to a ground according to a driving voltage of a driving node; and
a driving circuit, comprising:
a driver, comprising:
a high-side transistor, providing a low voltage to the driving node according to a high-side voltage of a high-side node;
a low-side transistor, coupling the driving node to the ground according to a control signal;
a high-side driver, comprising a plurality of N-type transistors and providing a high voltage to the high-side node according to the control signal, wherein the high voltage exceeds an operational gate voltage of the N-type transistors in the driving circuit, wherein the high voltage is equal to the supply voltage, wherein the high-side driver comprises:
a differential amplifier, comprising a positive input node, a negative input node, and an output node, wherein the positive input node receives the control signal, the negative input node is coupled to the driving node, and the output node is coupled to the high-side node; and
a first pre-driver, generating a first internal signal at a first internal node according to the control signal and an inverse of the control signal, wherein the high-side driver provides the high voltage to the high-side node according to the control signal and the first internal signal; and
a second regulator, down-converting a supply voltage to the low voltage.

15. The power circuit of claim 14, wherein the differential amplifier comprises:
a first amplifier normally-off transistor, comprising a source terminal, a gate terminal, and a drain terminal, wherein the gate terminal receives the control signal, the source terminal is coupled to a first amplifier node, the drain terminal is coupled to a second amplifier node;
a seventh resistor, coupled between the supply voltage and the second amplifier node;
a second amplifier normally-off transistor, comprising a source terminal, a gate terminal, and a drain terminal, wherein the gate terminal is coupled to the driving node, and the source terminal is coupled to the first amplifier node;
an eighth resistor, coupled between the supply voltage and the drain terminal of the second amplifier normally-off transistor;
an amplifier current source, sinking a bias current from the first amplifier node to the ground;
a third amplifier normally-off transistor, comprising a source terminal, a gate terminal, and a drain terminal, wherein the gate terminal is coupled to the second amplifier node, the source terminal is coupled to the ground, and the drain terminal is coupled to a third amplifier node;
a ninth resistor, coupled between the supply voltage and the third amplifier node;
a fourth amplifier normally-off transistor, comprising a source terminal, a gate terminal, and a drain terminal, wherein the gate terminal is coupled to the third amplifier node, the source terminal is coupled to the output node; and
a fifth amplifier normally-off transistor, comprising a source terminal, a gate terminal, and a drain terminal, wherein the gate terminal receives the first internal signal, the source terminal is coupled to the ground, and the drain terminal is coupled to the output node of the differential amplifier.

16. The power circuit of claim 15, wherein the amplifier further comprises:
a third clamp circuit, configured to clamp a voltage between the gate terminal and the source terminal of the fourth amplifier normally-off transistor.

17. The power circuit of claim 14, wherein the first pre-driver comprises:
a sixth amplifier normally-off transistor, comprising a source terminal, a gate terminal, and a drain terminal, wherein the source terminal is coupled to the first internal node, the gate terminal receives the inverse of the control signal, and the drain terminal is supplied by the low voltage;
a sixth amplifier normally-on transistor, comprising a source terminal, a gate terminal, and a drain terminal, wherein the source terminal and the gate terminal are both coupled to the first internal node and the drain terminal is supplied by the low voltage; and
a seventh amplifier normally-off transistor, comprising a source terminal, a gate terminal, and a drain terminal, wherein the source terminal is coupled to the ground, the gate terminal receives the control signal, and the drain terminal is coupled to the first internal node.

18. The power circuit of claim 14, wherein the driver further comprises:
a second pre-driver, generating a second internal signal at a second internal node according to a third internal signal and the control signal; and
a third pre-driver, generating a third internal signal at a third internal node according to the control signal and the inverse of the control signal;
wherein the first pre-driver generates the first internal signal according to the second internal signal and the third internal signal.

19. The power circuit of claim 18, wherein the second pre-driver comprises:
an eighth amplifier normally-off transistor, comprising a source terminal, a gate terminal, and a drain terminal, wherein the source terminal is coupled to the second internal node, the gate terminal receives the control signal, and the drain terminal is supplied by the low voltage;
a seventh amplifier normally-on transistor, comprising a source terminal, a gate terminal, and a drain terminal, wherein the source terminal and the gate terminal are both coupled to the second internal node and the drain terminal is supplied by the low voltage; and
a ninth amplifier normally-off transistor, comprising a source terminal, a gate terminal, and a drain terminal, wherein the source terminal is coupled to the ground, the gate terminal receives the third internal signal, and the drain terminal is coupled to the second internal node.

20. The power circuit of claim 19, wherein the third pre-driver comprises:
an tenth amplifier normally-off transistor, comprising a source terminal, a gate terminal, and a drain terminal, wherein the source terminal is coupled to the third internal node, the gate terminal receives the inverse of the control signal, and the drain terminal is supplied by the low voltage;
an eighth amplifier normally-on transistor, comprising a source terminal, a gate terminal, and a drain terminal, wherein the source terminal and the gate terminal are both coupled to the third internal node and the drain terminal is supplied by the low voltage; and
an eleventh amplifier normally-off transistor, comprising a source terminal, a gate terminal, and a drain terminal, wherein the source terminal is coupled to the ground, the gate terminal receives the control signal, and the drain terminal is coupled to the third internal node.

21. A driving circuit for driving a power transistor, wherein the power transistor sinks a power current to a ground according to a driving voltage of a driving node, comprising:
a driver, comprising:
a high-side transistor, providing a low voltage to a driving node according to a high-side voltage of a high-side node;
a low-side transistor, coupling the driving node to a ground according to a control signal;
a high-side driver, comprising a plurality of N-type transistors and providing a high voltage to the high-side node according to the control signal, wherein the high voltage exceeds an operational gate voltage of the N-type transistors;
a first pre-driver, generating a first internal signal at a first internal node according to the control signal and an inverse of the control signal, wherein the high-side driver provides the high voltage to the high-side node according to the control signal and the first internal signal;
a second pre-driver, generating a second internal signal at a second internal node according to a third internal signal and the control signal; and
a third pre-driver, generating a third internal signal at a third internal node according to the control signal and the inverse of the control signal;
wherein the first pre-driver generates the first internal signal according to the second internal signal and the third internal signal; and
a second regulator, down-converting a supply voltage to the low voltage.

22. The driving circuit of claim 21, wherein the power transistor is a GaN transistor.

23. The driving circuit of claim 21, further comprising:
a first regulator, down-converting the supply voltage to the high voltage, wherein the low voltage is lower than the high voltage.

24. The driving circuit of claim 23, wherein the first regulator comprises:
a first regulator normally-off transistor, comprising a source terminal, a gate terminal, and a drain terminal, wherein the gate terminal receives a reference voltage, the source terminal is coupled to a first regulator node, and the drain terminal is coupled to the second regulator node;
a first resistor, coupled between the supply voltage and the second regulator node;
a second regulator normally-off transistor, comprising a source terminal, a gate terminal, and a drain terminal, wherein the gate terminal receives a first feedback voltage and the source terminal is coupled to the first regulator node;
a second resistor, coupled between the supply voltage and the drain terminal of the second regulator normally-off transistor;
a first current source, sinking a first current from the first regulator node to the ground;
a third regulator normally-off transistor, comprising a source terminal, a gate terminal, and a drain terminal, wherein the gate terminal is coupled to the second regulator node, the source terminal is coupled to the ground, and the drain terminal is coupled to a third regulator node;

a third resistor, coupled between the supply voltage and the third regulator node;

a fourth regulator normally-off transistor, comprising a source terminal, a gate terminal, and a drain terminal, wherein the gate terminal is coupled to the third regulator node, the source terminal generates the high voltage, and the drain terminal is supplied by the supply voltage; and a first voltage divider, dividing the high voltage by a first factor to generate the first feedback voltage.

25. The driving circuit of claim 24, wherein the first regulator further comprises:

a first clamp circuit, configured to clamp a voltage between the gate terminal and the source terminal of the fourth regulator normally-off transistor under a breakdown voltage of the fourth regulator normally-off transistor.

26. The driving circuit of claim 23, wherein the high-side driver comprises:

a first normally-off transistor, comprising a source terminal, a gate terminal, and a drain terminal, wherein the source terminal is coupled to the high-side node, the gate terminal receives the control signal, and the drain terminal is supplied by the high voltage;

a first normally-on transistor, comprising a source terminal, a gate terminal, and a drain terminal, wherein the source terminal and the gate terminal are both coupled to the high-side node and the drain terminal is supplied by the high voltage; and a second normally-off transistor, comprising a source terminal, a gate terminal, and a drain terminal, wherein the source terminal is coupled to the ground, the gate terminal receives the first internal signal, and the drain terminal is coupled to the high-side node.

27. The driving circuit of claim 21, wherein the first pre-driver comprises:

a third normally-off transistor, comprising a source terminal, a gate terminal, and a drain terminal, wherein the source terminal is coupled to the first internal node, the gate terminal is coupled to a first node, and the drain terminal is supplied by the low voltage;

a fourth normally-off transistor, comprising a source terminal, a gate terminal, and a drain terminal, wherein the source terminal is coupled to the ground, the gate terminal receives the control signal, and the drain terminal is coupled to the first internal node;

a fifth normally-off transistor, comprising a source terminal, a gate terminal, and a drain terminal, wherein the source terminal is coupled to the first node, the gate terminal receives the inverse of the control signal, and the drain terminal is supplied by the high voltage;

a second normally-on transistor, comprising a source terminal, a gate terminal, and a drain terminal, wherein the source terminal and the gate terminal are both coupled to the first node and the drain terminal is supplied by the high voltage; and a sixth normally-off transistor, comprising a source terminal, a gate terminal, and a drain terminal, wherein the source terminal is coupled to the ground, the gate terminal receives the control signal, and the drain terminal is coupled to the first node.

28. The driving circuit of claim 21, wherein the second pre-driver comprises:

a seventh normally-off transistor, comprising a source terminal, a gate terminal, and a drain terminal, wherein the source terminal is coupled to the second internal node, the gate terminal is coupled to a second node, and the drain terminal is supplied by the low voltage;

an eighth normally-off transistor, comprising a source terminal, a gate terminal, and a drain terminal, wherein the source terminal is coupled to the ground, the gate terminal receives the third internal signal, and the drain terminal is coupled to the second internal node;

a ninth normally-off transistor, comprising a source terminal, a gate terminal, and a drain terminal, wherein the source terminal is coupled to the second node, the gate terminal receives the third internal signal, and the drain terminal is supplied by the high voltage;

a third normally-on transistor, comprising a source terminal, a gate terminal, and a drain terminal, wherein the source terminal and the gate terminal are both coupled to the second node and the drain terminal is supplied by the high voltage; and a tenth normally-off transistor, comprising a source terminal, a gate terminal, and a drain terminal, wherein the source terminal is coupled to the ground, the gate terminal receives the third internal signal, and the drain terminal is coupled to the second node.

29. The driving circuit of claim 28, wherein the third pre-driver comprises:

an eleventh normally-off transistor, comprising a source terminal, a gate terminal, and a drain terminal, wherein the source terminal is coupled to the third internal node, the gate terminal is coupled to a third node, and the drain terminal is supplied by the low voltage;

a twelfth normally-off transistor, comprising a source terminal, a gate terminal, and a drain terminal, wherein the source terminal is coupled to the ground, the gate terminal receives the control signal, and the drain terminal is coupled to the third internal node;

a thirteenth normally-off transistor, comprising a source terminal, a gate terminal, and a drain terminal, wherein the source terminal is coupled to the third node, the gate terminal receives the inverse of the control signal, and the drain terminal is supplied by the high voltage;

a fourth normally-on transistor, comprising a source terminal, a gate terminal, and a drain terminal, wherein the source terminal and the gate terminal are both coupled to the third node and the drain terminal is supplied by the high voltage; and a fourteenth normally-off transistor, comprising a source terminal, a gate terminal, and a drain terminal, wherein the source terminal is coupled to the ground, the gate terminal receives the control signal, and the drain terminal is coupled to the third node.

30. The driving circuit of claim 21, wherein the second regulator comprises:

a fifth regulator normally-off transistor, comprising a source terminal, a gate terminal, and a drain terminal, wherein the gate terminal receives a reference voltage, the source terminal is coupled to a fourth regulator node, and the drain terminal is coupled to the fifth regulator node;

a fourth resistor, coupled between the supply voltage and the second regulator node;

a sixth regulator normally-off transistor, comprising a source terminal, a gate terminal, and a drain terminal, wherein the gate terminal receives a second feedback voltage and the source terminal is coupled to the fourth regulator node;

a fifth resistor, coupled between the supply voltage and the drain terminal of the sixth regulator normally-off transistor;

a second current source, sinking a second current from the fourth regulator node to the ground;

a seventh normally-off transistor, comprising a source terminal, a gate terminal, and a drain terminal, wherein the gate terminal is coupled to the fifth regulator node, the source terminal is coupled to the ground, and the drain terminal is coupled to the a sixth regulator node;

a sixth resistor, coupled between the supply voltage and the sixth regulator node;

an eighth normally-off transistor, comprising a source terminal, a gate terminal, and a drain terminal, wherein the gate terminal is coupled to the sixth regulator node, the source terminal generates the low voltage, and the drain terminal is supplied by the supply voltage; and a second voltage divider, dividing the low voltage by a second factor to generate the second feedback voltage.

31. The driving circuit of claim 30, wherein the second regulator further comprises:
a second clamp circuit, configured to clamp a voltage between the gate terminal and the source terminal of the eighth regulator normally-off transistor under a breakdown voltage of the eighth regulator normally-off transistor.

32. The driving circuit of claim 21, further comprising:
an under-voltage lockout circuit, supplied by the low voltage and pulling down the control signal to the ground when the supply voltage is less than a threshold.

33. The driving power circuit of claim 32, wherein the under-voltage lockout circuit comprises:
a third voltage divider, dividing the supply voltage to generate a divided voltage;
a fifth normally-on transistor, comprising a source terminal, a gate terminal, and a drain terminal, wherein the source terminal and the gate terminal are both coupled to a first under-voltage node and the drain terminal is supplied by the low voltage;
a fifteenth normally-off transistor, comprising a source terminal, a gate terminal, and a drain terminal, wherein the source terminal is coupled to the ground, the gate terminal receives the divided voltage, and the drain is coupled to the first under-voltage node;
a sixteenth normally-off transistor, comprising a source terminal, a gate terminal, and a drain terminal, wherein the source terminal is coupled to a second under-voltage node, the gate terminal is coupled to the first under-voltage node, and the drain is coupled to a third under-voltage node;
an under-voltage resistor, coupled between the low voltage and a third under-voltage node;
a seventeenth normally-off transistor, comprising a source terminal, a gate terminal, and a drain terminal, wherein the source terminal is coupled to the ground, the gate terminal is coupled to the first under-voltage node, and the drain is coupled to the second under-voltage node;
an eighteenth normally-off transistor, comprising a source terminal, a gate terminal, and a drain terminal, wherein the source terminal is coupled to the second under-voltage node, the gate terminal is coupled to the third under-voltage node, and the drain is coupled to a fourth under-voltage node;
a nineteenth normally-off transistor, comprising a source terminal, a gate terminal, and a drain terminal, wherein the source terminal is coupled to an under-voltage lockout node, the gate terminal is coupled to the fourth under-voltage node, and the drain is supplied by the low voltage;
a twentieth normally-off transistor, comprising a source terminal, a gate terminal, and a drain terminal, wherein the source terminal is coupled to the ground, the gate terminal is coupled to the third under-voltage node, and the drain is coupled to the under-voltage lockout node, wherein an under-voltage lockout signal is generated at the under-voltage lockout node; and
a twenty-first normally-off transistor, comprising a source terminal, a gate terminal, and a drain terminal, wherein the source terminal is coupled to the ground, the gate terminal is coupled to the under-voltage lockout node, and the drain is coupled to the control signal, wherein the twenty-first normally-off transistor pulls the control signal to the ground according to the under-voltage lockout signal.

34. A driving circuit for driving a power transistor, wherein the power transistor sinks a power current to a ground according to a driving voltage of a driving node, comprising:
a driver, comprising:
a high-side transistor, providing a low voltage to the driving node according to a high-side voltage of a high-side node;
a low-side transistor, coupling the driving node to the ground according to a control signal;
a high-side driver, comprising a plurality of N-type transistors and providing a high voltage to the high-side node according to the control signal, wherein the high voltage exceeds an operational gate voltage of the N-type transistors, wherein the high voltage is equal to the supply voltage, wherein the high-side driver comprises:
a differential amplifier, comprising a positive input node, a negative input node, and an output node, wherein the positive input node receives the control signal, the negative input node is coupled to the driving node, and the output node is coupled to the high-side node; and
a first pre-driver, generating a first internal signal at a first internal node according to the control signal and an inverse of the control signal, wherein the high-side driver provides the high voltage to the high-side node according to the control signal and the first internal signal; and
a second regulator, down-converting a supply voltage to the low voltage.

35. The driving circuit of claim 34, wherein the differential amplifier comprises:
a first amplifier normally-off transistor, comprising a source terminal, a gate terminal, and a drain terminal, wherein the gate terminal receives the control signal, the source terminal is coupled to a first amplifier node, the drain terminal is coupled to a second amplifier node;
a seventh resistor, coupled between the supply voltage and the second amplifier node;
a second amplifier normally-off transistor, comprising a source terminal, a gate terminal, and a drain terminal, wherein the gate terminal is coupled to the driving node, and the source terminal is coupled to the first amplifier node;
an eighth resistor, coupled between the supply voltage and the drain terminal of the second amplifier normally-off transistor;

an amplifier current source, sinking a bias current from the first amplifier node to the ground;

a third amplifier normally-off transistor, comprising a source terminal, a gate terminal, and a drain terminal, wherein the gate terminal is coupled to the second amplifier node, the source terminal is coupled to the ground, and the drain terminal is coupled to a third amplifier node;

a ninth resistor, coupled between the supply voltage and the third amplifier node;

a fourth amplifier normally-off transistor, comprising a source terminal, a gate terminal, and a drain terminal, wherein the gate terminal is coupled to the third amplifier node, the source terminal is coupled to the output node; and a fifth amplifier normally-off transistor, comprising a source terminal, a gate terminal, and a drain terminal, wherein the gate terminal receives the first internal signal, the source terminal is coupled to the ground, and the drain terminal is coupled to the output node of the differential amplifier.

36. The driving circuit of claim 35, wherein the amplifier further comprises:
a third clamp circuit, configured to clamp a voltage between the gate terminal and the source terminal of the fourth amplifier normally-off transistor.

37. The driving circuit of claim 34, wherein the first pre-driver comprises:
a sixth amplifier normally-off transistor, comprising a source terminal, a gate terminal, and a drain terminal, wherein the source terminal is coupled to the first internal node, the gate terminal receives the inverse of the control signal, and the drain terminal is supplied by the low voltage;
a sixth amplifier normally-on transistor, comprising a source terminal, a gate terminal, and a drain terminal, wherein the source terminal and the gate terminal are both coupled to the first internal node and the drain terminal is supplied by the low voltage; and
a seventh amplifier normally-off transistor, comprising a source terminal, a gate terminal, and a drain terminal, wherein the source terminal is coupled to the ground, the gate terminal receives the control signal, and the drain terminal is coupled to the first internal node.

38. The driving circuit of claim 34, wherein the driver further comprises:

a second pre-driver, generating a second internal signal at a second internal node according to a third internal signal and the control signal; and a third pre-driver, generating a third internal signal at a third internal node according to the control signal and the inverse of the control signal;

wherein the first pre-driver generates the first internal signal according to the second internal signal and the third internal signal.

39. The driving circuit of claim 38, wherein the second pre-driver comprises:
an eighth amplifier normally-off transistor, comprising a source terminal, a gate terminal, and a drain terminal, wherein the source terminal is coupled to the second internal node, the gate terminal receives the control signal, and the drain terminal is supplied by the low voltage;
a seventh amplifier normally-on transistor, comprising a source terminal, a gate terminal, and a drain terminal, wherein the source terminal and the gate terminal are both coupled to the second internal node and the drain terminal is supplied by the low voltage; and
a ninth amplifier normally-off transistor, comprising a source terminal, a gate terminal, and a drain terminal, wherein the source terminal is coupled to the ground, the gate terminal receives the third internal signal, and the drain terminal is coupled to the second internal node.

40. The driving circuit of claim 39, wherein the third pre-driver comprises:
an tenth amplifier normally-off transistor, comprising a source terminal, a gate terminal, and a drain terminal, wherein the source terminal is coupled to the third internal node, the gate terminal receives the inverse of the control signal, and the drain terminal is supplied by the low voltage;
an eighth amplifier normally-on transistor, comprising a source terminal, a gate terminal, and a drain terminal, wherein the source terminal and the gate terminal are both coupled to the third internal node and the drain terminal is supplied by the low voltage; and
an eleventh amplifier normally-off transistor, comprising a source terminal, a gate terminal, and a drain terminal, wherein the source terminal is coupled to the ground, the gate terminal receives the control signal, and the drain terminal is coupled to the third internal node.

* * * * *